United States Patent [19]
Yamamoto

[11] Patent Number: 5,521,410
[45] Date of Patent: *May 28, 1996

[54] POWER SEMICONDUCTOR DEVICE COMPRISING VERTICAL DOUBLE-DIFFUSED MOSFETS EACH HAVING LOW ON-RESISTANCE PER UNIT AREA

[75] Inventor: Masanori Yamamoto, Tokyo, Japan

[73] Assignee: NEC Corporation, Tokyo, Japan

[21] Appl. No.: 215,110

[*] Notice: The term of this patent shall not extend beyond the expiration date of Pat. No. 5,408,118.

[22] Filed: Mar. 21, 1994

[30] Foreign Application Priority Data

Mar. 22, 1993 [JP] Japan .................................. 5-062209

[51] Int. Cl.$^6$ ........................... H01L 29/76; H01L 29/94; H01L 31/062
[52] U.S. Cl. ......................... 257/342; 257/401; 257/382; 257/341
[58] Field of Search .................................. 257/329, 339, 257/341, 335, 337, 342, 331, 334, 346, 401, 382, 377

[56] References Cited

U.S. PATENT DOCUMENTS

| | | | |
|---|---|---|---|
| 5,008,725 | 4/1991 | Lidow et al. | 257/401 |
| 5,016,066 | 5/1991 | Takahashi | 257/401 |
| 5,408,118 | 7/1995 | Yamamoto | 257/342 |

FOREIGN PATENT DOCUMENTS

| | | | |
|---|---|---|---|
| 52-132684 | 11/1977 | Japan | 29/78 |
| 1-238173 | 9/1989 | Japan | 257/342 |

OTHER PUBLICATIONS

Sun S. C. and Plummber, James D., "Modeling Of The On–Resistance of LDMOS, VDMOS, And VMOS Power Transistors", IEEE Transactions on Electron Devices, vol. ED–27, No. 2 Feb., 1990, pp. 356–367.

Primary Examiner—Wael M. Fahmy
Attorney, Agent, or Firm—Popham, Haik, Schnobrich & Kaufman, Ltd.

[57] ABSTRACT

In a vertical double-diffused MOSFET comprising a semiconductor substrate of a first conductivity type, an epitaxial layer of the first conductivity type, and a gate insulating layer, a gate electrode coats the gate insulating layer. The gate electrode has a plurality of polygonal shaped opening windows and at least one slit shaped opening window. Each polygonal shaped opening window has a center positioned on each of lattice points of a two-dimensional square lattice comprising a plurality of unit cells. Each slit shaped opening window is laid on a straight line connecting two centers of two polygonal shaped opening windows which are obliquely adjacent to one another. A first insulating layer is formed on an upper surface of the gate electrode. Second insulating layers are formed on side walls of the gate electrode. A base region of a second conductivity type having a base junction depth is formed in the surface of the epitaxial layer. The base region is self-aligned to the polygonal shaped opening windows and the slit shaped opening window. A source region of the first conduction type has a source junction depth shallower than the base junction depth. The source region has an inner edge self-aligned to both of the polygonal shaped opening windows and the slit shaped opening window and an inner edge spaced apart from the polygonal shaped open windows at a predetermined width.

46 Claims, 18 Drawing Sheets

POWER SEMICONDUCTOR DEVICE COMPRISING VERTICAL DOUBLE-DIFFUSED MOSFETS EACH HAVING LOW ON-RESISTANCE PER UNIT AREA

BACKGROUND OF THE INVENTION

This invention relates to a vertical double-diffused metal oxide semiconductor field effect transistor for use in a power semiconductor device and, in particular, to a vertical double-diffused metal oxide semiconductor field effect transistor with a low breakdown voltage.

Metal oxide semiconductor field effect transistors (hereinafter referred to as "MOSFETs") are used as elements for use in a power semiconductor device in place of bipolar transistors because of superiority over switching speed or the like. Such MOSFETs are classified into double-diffused self-aligned MOSFETs (hereinafter referred to as "DSA-MOSFETs") and vertical double-diffused MOSFETs (hereinafter referred to as "VDMOSFETs"). The VDMOSFETs are used in the power semiconductor device for ease of of workability and so on.

In general, a power semiconductor device comprises a plurality of VDMOSFETs which have the structure as follows. The semiconductor device comprises an $N^+$-type silicon substrate where "$N^+$" represents a high N-type impurity concentration. The $N^+$-type silicon substrate has a main or upper surface on which an $N^-$-type epitaxial layer is formed where "$N^-$" represents a low N-type impurity concentration. The $N^-$-type epitaxial layer has a predetermined film thickness. The epitaxial layer has a surface on which a gate oxide layer and a gate electrode are formed in this order. The gate oxide layer has a predetermined thickness. The gate electrode consists of an $N^+$-type polysilicon having a predetermined thickness. The gate electrode (and the gate oxide layer) has a plurality of polygonal opening windows each of which has a desired form and which are regularly arranged to each other. The $N^+$-type epitaxial layer has therefore a plurality of partial surfaces which are exposed through the polygonal opening windows. In the partial surfaces of the $N^+$-type epitaxial layer are formed a plurality of $P^+$-type base regions with the base regions self-aligned to the polygonal opening windows or edge portions of the gate electrode, where "$P^+$" represents a high P-type impurity concentration. In the partial surfaces of the $N^+$-type epitaxial layer are formed a plurality of $N^+$-type source regions each of which is annular in shape. That is, each of the $N^+$-type source regions has one end which is self-aligned to the edge portions of the gate electrode. The semiconductor device comprises the VDMOSFETs which are formed in the polygonal opening windows. The VDMOSFETs comprise the $P^+$-type base regions and the $N^+$-type source regions, respectively, and comprise the gate electrode in common. The $P^+$-type base regions have a plurality of surfaces which are exposed near central portions of the polygonal opening windows. In other words, in the surfaces of the $P^+$-type base regions in the polygonal opening windows, the $N^+$-type source regions are not formed in entire surfaces of the polygonal opening windows but are formed in partial surfaces of the polygonal opening windows that have a predetermined width at the edge portions of the gate electrode.

On the gate electrode and the polygonal opening windows covers an interlayer insulating layer having a plurality of contact holes which reach the $P^+$-type base regions and the $N^+$-type source regions formed in the polygonal opening windows. On the interlayer insulating layer is formed a source electrode which electrically connects to all of the $P^+$-type base regions and the $N^+$-type source regions through the contact holes. An N-type drain region is formed in the VDMOSFETs in common and is composed of the $N^-$-type epitaxial layer and the $N^+$-type silicon substrate. The $N^+$-type silicon substrate has a bottom or back surface which is opposite to the main surface thereof and on which a drain electrode is formed with the drain electrode electrically connected to the $N^+$-type silicon substrate. As described above, the power semiconductor device comprises the VDMOSFETs which are equal in number to the polygonal opening windows and which are electrically connected to each other in parallel.

Each of the $P^+$-type base regions has a base junction depth which is defined by a vertical base junction depth $X_{jb}$ in a vertical direction and a horizontal base junction depth $X_{jb,1}$ in a horizontal direction beneath the gate electrode in the edge portions of the gate electrode. The horizontal base junction depth $X_{jb,1}$ is about 0.8 times as large as the vertical base junction depth $X_{jb}$ (namely, $X_{jb,1} \approx 0.8 X_{jb}$). On the other hand, each of the $N^+$-type source regions has a source junction depth which is defined by a vertical source junction depth $X_{js}$ in a vertical direction and a horizontal source junction depth $X_{js,1}$ in a horizontal direction beneath the gate electrode in the edge portions of the gate electrode. The vertical source junction depth $X_{js}$ is shallower than the vertical base junction depth $X_{jb}$ (namely, $X_{js} < X_{jb}$). The horizontal source junction depth $X_{js,1}$ is about 0.8 times as large as the vertical source junction depth $X_{js}$ (namely, $X_{js,1} \approx 0.8 X_{js}$). Each VDMOSFET has a channel region which is a part of the $P^+$-type base region directly connected to the gate oxide layer beneath the gate electrode. The channel region has a channel length which is about equal to the horizontal base junction depth $X_{jb,1}$ minus the horizontal source junction depth $X_{js,1}$ (namely, $X_{jb,1} - X_{js,1}$). The gate electrode has a gate electrode length $L_G$ which is equal to the shortest distance between two opening windows adjacent to one another. If gate electrode length $L_G$ is longer than twice of the horizontal base junction depth $X_{jb,1}$ (namely, $L_G > 2 X_{jb,1}$), the VDMOSFETs are formed in the gate electrode.

Each of the opening windows in the gate electrode has the shape which is generally classified into a square and a regular hexagon. A gate electrode having square shaped opening windows have been disclosed in Japanese Unexamined Patent Prepublication No. 132684/77 issued on Nov. 7, 1977. The square shaped opening windows are arranged so that each of the square opening windows has a center which is positioned on each of lattice points in a two-dimensional square lattice having a desired lattice interval. Each of the square shaped opening windows has four sides which are parallel to the square lattice. In addition, the gate electrode having the square shaped opening windows may be modified into a gate electrode having octagonal shaped open windows. Such a gate electrode is disclosed in U.S. Pat. No. 5,016,066 which issued on May 14, 1991 to Mitsuasa Takahashi for assignment to the present assignee. A gate electrode having regular hexagonal shaped open windows is disclosed in U.S. Pat. No. 5,008,725 issued on Apr. 16, 1991. The regular hexagonal shaped open windows are arranged with close-packed. Both of U.S. Pat. No. 5,016,066 and U.S. Pat. No. 5,008,725 propose VDMOS-FETs having a high breakdown voltage $BV_{DSS}$ where $BV_{DSS}$ represents a breakdown voltage between the drain regions and the source regions when the source and the gate electrodes are short-circuited. Accordingly, contrivance is made as regards a distribution of impurity concentration in the drain regions beneath the gate electrode and so on.

In the manner which will later be described, conventional VDMOSFETs are disadvantageous in that it is difficult to decrease on-resistance per unit area. As a result, it is difficult to improve switching speed and current density in the power semiconductor device which comprises the conventional VDMOSFETs each having a low breakdown voltage.

SUMMARY OF THE INVENTION

It is therefore an object of this invention to provide a VDMOSFET which is capable of decreasing on-resistance per unit area.

It is another object of this invention to provide a power semiconductor device comprising a plurality of VDMOSFETs of the type described, which is capable of improved switching speed and current density thereof.

Other objects of this invention will become clear as the description proceeds.

According to an aspect of this invention, a vertical double-diffused metal oxide semiconductor field effect transistor (MOSFET) comprises a semiconductor substrate of a first conductivity type. The semiconductor substrate has a main surface and a bottom surface opposite to the main surface. The semiconductor substrate is doped with impurities of the first conductivity type that has substrate impurity concentration. An epitaxial layer of the first conductivity type is formed on the main surface of the semiconductor substrate. The epitaxial layer has a predetermined thickness and is doped with impurities of the first conductivity type that has epitaxial impurity concentration lower than the substrate impurity concentration of the semiconductor substrate. A gate insulating layer is formed on a surface of the epitaxial layer. A gate electrode coats the gate insulating layer. The gate electrode has a plurality of polygonal shaped opening windows each of which has a center positioned on each of lattice points of a two-dimensional square lattice comprising a plurality of unit cells. Each of the unit cells is defined by two pairs of opposed sides. One pair of the opposed sides extends along a first direction and is apart from one another at a predetermined distance. Another pair of the opposed sides extends along a second direction orthogonal to the first direction and is apart from one another at the predetermined distance. The gate electrode has at least one slit shaped opening window with a predetermined slit width. The slit shaped opening window is laid on a straight line connecting two centers of two polygonal shaped opening windows which are obliquely adjacent to one another. A first insulating layer is formed on an upper surface of the gate electrode. A second insulating layer is formed on side walls of the gate electrode. A base region is of a second conductivity type which is opposite to the first conductivity type. The base region has a predetermined base junction depth. The base region is formed in the surface of the epitaxial layer. The base region is self-aligned to the polygonal shaped opening windows and the slit shaped opening window. A source region of the first conduction type has a source junction depth shallower than the base junction depth. The source region has an outer edge self-aligned to both of the polygonal shaped opening windows and the slit shaped opening window and an inner edge spaced apart from edges of the polygonal shaped open windows at a predetermined width. A source electrode covers the first and the second insulating layers. The source electrode is directly connected to the source region with the source electrode short-circuited to the base region in at least the polygonal shaped opening windows. A drain electrode is formed on the bottom surface of the semiconductor substrate.

DESCRIPTION OF THE PREFERRED EMBODIMENTS

Figure 1:
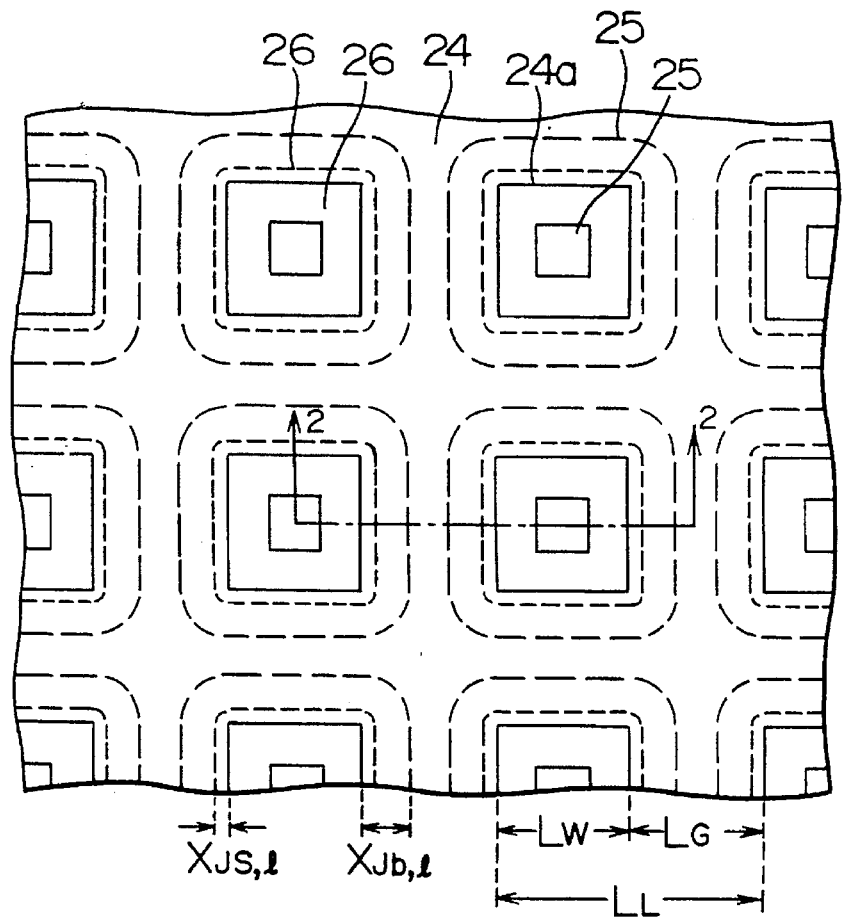
FIG. 1 shows a plane view of a part of a conventional semiconductor device.
Figure 2:
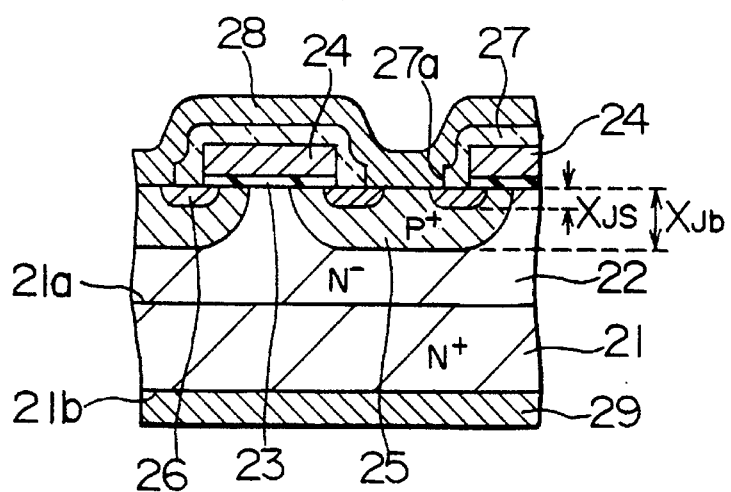
FIG. 2 shows a sectional view taken substantially along the lines 2—2 of FIG. 1.

Referring to FIGS. 1 and 2, a conventional power semiconductor device will first be described in order to facilitate an understanding of the present invention. The illustrated power semiconductor device is disclosed in the above-mentioned Japanese Unexamined Patent Prepublication No. 132684/77. FIG. 1 shows a plane view of a part of the power semiconductor device comprising a plurality of VDMOSFETs. In FIG. 1, for the purpose of simplification of drawing, layers higher than a gate electrode, such as a source electrode and so on are omitted. FIG. 2 shows a sectional view taken substantially along the lines 2—2 of FIG. 1. In FIG. 2, the layers higher than the gate electrode, such as the source electrode are illustrated. In addition, P$^+$-type base regions have a simplified shape into which is modified that illustrated in the above-mentioned Japanese Unexamined Patent Prepublication No. 132684/77. This is because the present invention relates to a power semiconductor device comprising a plurality of VDMOSFETs with a low breakdown voltage.

As shown in FIG. 2, the power semiconductor device comprises an N$^+$-type silicon (Si) substrate 21 having main and bottom surfaces 21a and 21b which are directed upwards of FIG. 2. An N$^-$-type epitaxial layer 22 having a predetermined thickness is formed on the main surface 21a in the manner which is well known in the art. A gate oxide layer 23 and the gate electrode 24 are formed on a surface of the N$^-$-type epitaxial layer 22. The gate oxide layer 23 has a predetermined thickness. The gate electrode 24 has a predetermined thickness and a gate electrode length $L_G$ as shown in FIG. 1. The gate electrode 24 is composed of an N$^+$-type polysilicon layer.

As shown in FIG. 1, the gate electrode 24 has a plurality of square shaped opening windows 24a. Each of the square shaped opening windows 24a has four sides each having a side length of $L_W$. The square shaped opening windows 24a are arranged with a space of the gate electrode length $L_G$ in vertical and lateral directions in FIG. 1. In other words, each square shaped opening window 24a has a center positioned on a lattice point of a two-dimensional square lattice which a lattice interval (or a lattice constant $L_L$ equal to a sum of the gate electrode length $L_G$ and the side length $L_W$ (namely, $L_L = L_G + L_W$)) in first and second directions which are perpendicular to one another. The four sides of each square shaped opening window 24a are parallel to the first or the second directions. One VDMOSFET is formed in one of the square shaped opening windows 24a. On VDMOSFET has an occupied area (cell size) equal to $L_L^2$.

In each VDMOSFET, a P$^+$-type base region 25 is formed in the N$^-$-type epitaxial layer 22 with the P$^+$-type base region 25 self-aligned to each square shaped opening window 24a as shown in FIG. 2. The P$^+$-type base region 25 has a vertical base junction depth $X_{jb}$ in a vertical direction as shown in FIG. 2. The P$^+$-type base region 25 has a horizontal base junction depth $X_{jb,1}$ beneath the gate electrode 24 as shown in FIG. 1. The horizontal base junction depth $X_{jb,1}$ is about 0.8 times the vertical base junction depth $X_{jb}$, namely, $X_{jb,1} \approx 0.8 X_{jb}$. As shown in FIG. 1, the gate electrode length $L_G$ is longer than twice of the horizontal base junction depth $X_{jb,1}$, namely, $2 X_{jb,1} < L_G$. An N$^+$-type source region 26 is formed in the P$^+$-type base region 25. The N$^+$-type source region 26 has an end self-aligned to the square shaped opening window 24a and another end which is apart from an edge of the square shaped opening window 24a at a predetermined width. That is, the N$^+$-type source region 26 is annular in shape. The P$^+$-type base region 25 has a partial surface exposed in a central portion of the square shaped opening window 24a. The N$^+$-type source region 26 has a vertical source junction depth $X_{js}$ which is shallower than the vertical base junction depth $X_{jb}$, namely, $X_{js} < X_{jb}$ as shown in FIG. 2. The N$^+$-type source region 26 has a horizontal source junction depth $X_{js,1}$ beneath the gate electrode 24 as shown in FIG. 1. The horizontal source junction depth $X_{js,1}$ is about 0.8 times the vertical source junction depth $X_{js}$, namely, $X_{js,1} \approx 0.8 X_{js}$.

The gate electrode 24 including the square shaped opening window 24a is covered by an interlayer insulating film 27. The interlayer insulating film 27 has a plurality of contact holes 27a each of which reaches the square shaped opening window 24a. In each contact hole 27a, an entire exposed surface of the P$^+$-type base region 25 and a part of an exposed surface of the N$^+$-type source region 26 are exposed. A source electrode 28 is formed on the interlayer insulating film 27. The source electrode 28 consists of a metal film. The source electrode 28 is directly connected to the N$^+$-type source region 26 and the P$^+$-type base region 25 through the contact hole 27a. A drain electrode 29 is formed on the bottom surface of the N$^+$-type silicon substrate 21. The drain electrode 29 consists of a metal film. In each VDMOSFET, a combination of the N$^-$-type silicon substrate 21 and the N$^-$-type epitaxial layer 22 serves as an N-type drain region.

The VDMOSFET has a significant characteristic which is called "on-resistance". When the on-resistance is low, the power semiconductor device has a high switching speed and a high current density. According to a paper by S. C. Sun et al submitted to IEEE TRANSACTIONS ON ELECTRON DEVICES, VOL. ED-27, NO. 2 (February, 1980), pages 356–367, and which has a title of "Modeling of the On-Resistance of LDMOS, VDMOS, and VMOS Power Transistors", a total on-resistance $R_{ON}$ is given by, with neglect of a contact resistance between the source electrode 28 and the source region 26 and so on:

$$R_{ON} = R_E + R_D + R_{JFET} + R_{SUB},$$

where $R_E$ represents an enhancement-mode on-resistance of a channel region in the VDMOSFET, $R_D$ represents a depletion-mode on-resistance of a storage layer in the drain region (the epitaxial layer) 22 beneath the gate electrode 24, $R_{JFET}$ represents an on-resistance in a junction FET, and $R_{SUB}$ represents an on-resistance in the epitaxial layer 22 and the silicon substrate 21 except for the junction FET region.

In the VDMOSFET with a high breakdown voltage, to increase $BV_{DSS}$, it is necessary to thicken the thickness of the epitaxial layer 22, to decrease the impurity concentration of the epitaxial layer 22, and to deepen the vertical base junction depth $X_{jb}$ of the base region 25. Accordingly, the total on-resistance $R_{ON}$ in the VDMOSFET with the high breakdown voltage is controlled by $(R_D + R_{JFET} + R_{SUB})$ in comparison with $R_E$.

On the other hand, in the VDMOSFET with a low breakdown voltage, it is possible to thin the thickness of the epitaxial layer 22, to increase the impurity concentration of the epitaxial layer 22, and to make shallow the vertical base junction depth $X_{jb}$ of the base region 25. Accordingly, the total on-resistance $R_{ON}$ in the VDMOSFET with the low breakdown voltage is controlled by $R_E$. In order to decrease total on-resistance $R_{ON}$, it is necessary to shorten a channel length and to widen a channel width. This is because $R_E$ is directly proportional to the ratio of the channel length to the channel width, namely, (the channel length/the channel width). The channel length is restricted by a punch through characteristic. As a result, it is necessary to widen the channel width as much as possible. In view of the power semiconductor device, it is important to decrease the on-resistance per unit area (a normalized on-resistance $A_C \cdot R_{ON}$) in the power semiconductor device. When one VDMOSFET with the low breakdown voltage has the occupied area or the cell size which is represented $A_C$, the VDMOSFETs are equal in number to $1/A_C$ per unit area. That is, $(1/A_C)$ VDMOSFETs are connected to each other in parallel per unit area. Accordingly, it is necessary to decrease the normalized on-resistance $A_C \cdot R_{ON}$. It must decrease the normalized on-resistance $A_C \cdot R_{ON}$. In other words, it must widen the channel width unit area.

The present inventor had carried out experiments on calculating design parameters in order to minimize the normalized on-resistance $A_C \cdot R_{ON}$ in the VDMOSFET with the low breakdown voltage $BV_{DSS}$ of about 30 volts in which a power voltage is equal to 5 volts and which has the structure illustrated in FIGS. 1 and 2. The experiment had been carried out under the conditions as follows. The $N^+$-type silicon substrate 21 has the electrical resistivity of 10 m$\Omega$·cm and the thickness of 450 μm. The $N^-$-epitaxial layer has the electrical resistivity of 0.4 $\Omega$·cm and the thickness of 6.5 μm. The gate oxide film 23 has the thickness of 50 nm. A threshold voltage is equal to 1.5 V. The normalized on-resistance $A_C \cdot R_{ON}$ was measured under the condition of a gate applying voltage $V_{GS}$ which is equal to 4 V. In addition, the square shaped opening window 24a has the four sides each having the fixed length $L_W$ equal to 7.0 μm.

Figure 3:
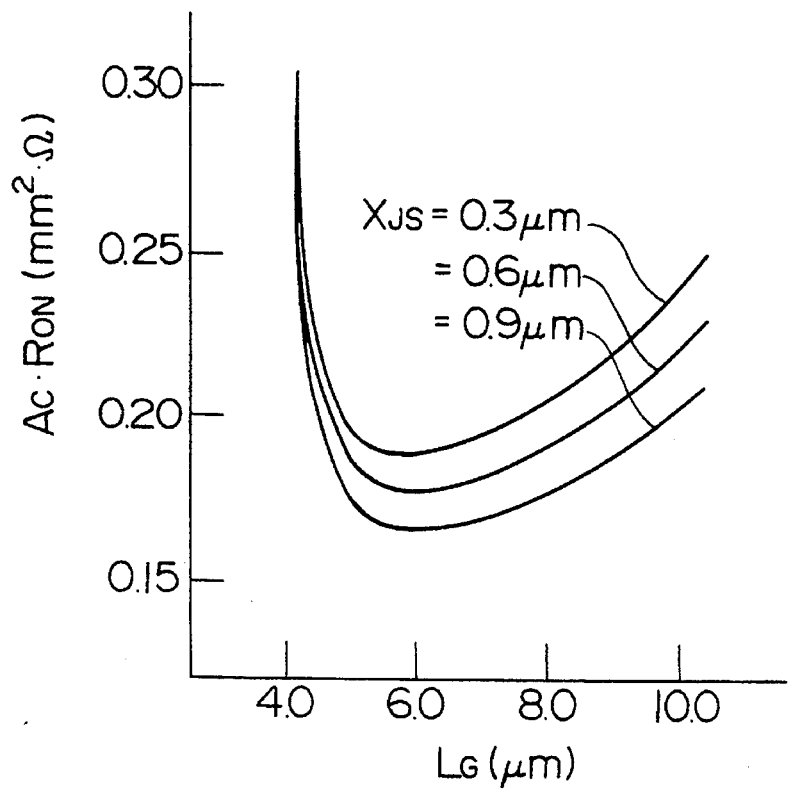
FIG. 3 shows characteristics of normalized on-resistance ($A_C \cdot R_{ON}$) versus a gate electrode length $L_G$ when a vertical source junction depth $X_{js}$ varies as a parameter.
Figure 4:
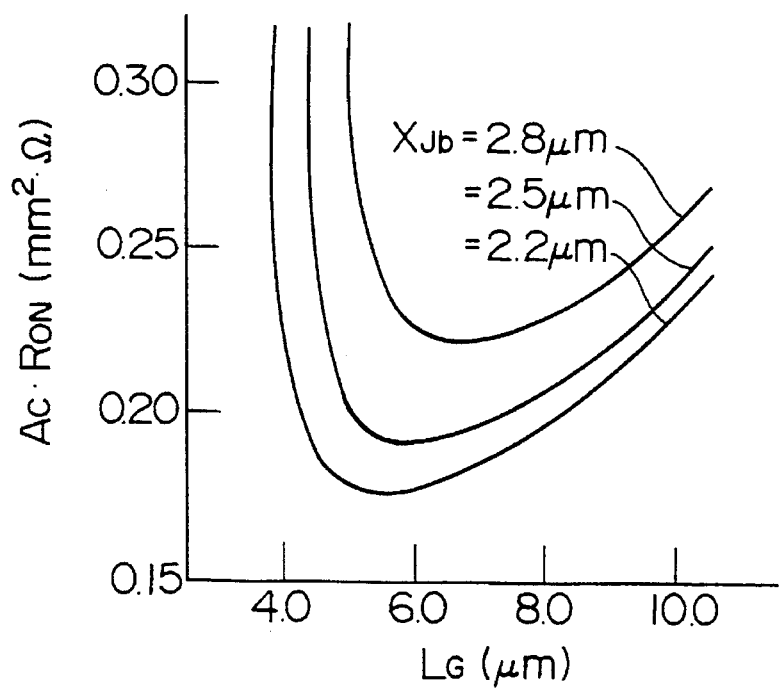
FIG. 4 shows characteristics of normalized on-resistance ($A_C \cdot R_{ON}$) versus the gate electrode length $L_G$ when a vertical base junction depth $X_{jb}$ varies as a parameter.

FIGS. 3 and 4 show characteristics of the normalized on-resistance $A_C \cdot R_{ON}$ versus the gate electrode length $L_G$. In each of FIGS. 3 and 4, the abscissa and the ordinate represent the gate electrode length $L_G$ (μm) and the normalized on-resistance $A_C \cdot R_{ON}$ (mm$^2 \cdot \Omega$), respectively. FIG. 3 shows characteristics of the normalized on-resistance $A_C \cdot R_{ON}$ when the vertical source junction depth $X_{js}$ varies as a parameter at 0.3 μm, 0.6 μm, and 0.9 μm with the vertical base junction depth $X_{jb}$ fixed at 2.5 μm. FIG. 4 shows characteristics of the normalized on-resistance $A_C \cdot R_{ON}$ when the vertical base junction depth $X_{jb}$ varies as a parameter at 2.8 μm, 2.5 μm, and 2.2 μm with the vertical source junction depth $X_{js}$ fixed at 0.6 μm. Referring to FIGS. 3 and 4, the following is apparent.

At first, if the vertical base junction depth $X_{jb}$ is fixed, the gate electrode length $L_G$ where the normalized on-resistance $A_C \cdot R_{ON}$ is minimized is not dependent upon the channel length which is about the horizontal base junction depth $X_{jb,1}$ minus the horizontal source junction depth $X_{js,1}$, namely, $(\approx X_{jb,1} - X_{js,1})$. When the vertical base junction depth $X_{jb}$ is equal to 2.5 μm, the normalized on-resistance $A_C \cdot R_{ON}$ increases in proportion as the gate electrode length $L_G$ shortens under 6.0 μm. This is because the $(R_D + R_{JFET})$ is superior in the on-resistance $R_{ON}$ of one VDMOSFET to $(R_E + R_{SUB})$. In addition, the normalized on-resistance $A_C \cdot R_{ON}$ extremely decreases at the gate electrode length $L_G$ of 4.0 μm. This is because the $P^+$-type base regions in two adjacent VDMOSFETs are substantially connected to one another.

In the second place, the gate electrode length $L_G$ where the normalized on-resistance $A_C \cdot R_{ON}$ is minimized is about three times of horizontal base junction depth $X_{jb,1}$, namely, $L_G \approx 3X_{jb,1}$. As a result, if the vertical base junction depth $X_{jb}$ is equal to 2.5 μm ($X_{jb}$=2.5 μm) and if the vertical source junction depth $X_{js}$ is equal to 0.6 μm ($X_{js}$=0.6 μm), the channel width per unit area has the maximum value (about 191 mm per 1 mm$^2$) and the normalized on-resistance $A_C \cdot R_{ON}$ has the minimum value when the gate electrode length $L_G$ is equal to 6.0 μm ($L_G$=6.0 μm) and when the width $L_W$ is equal to 4.0 μm ($L_W$=4.0 μm). In this event, according to measurement, the normalized on-resistance $A_C \cdot R_{ON}$ is about 0.171 mm (hereinafter this value will be referred to the minimum value of the normalized on-resistance $A_C \cdot R_{ON}$ in the square shaped opening window).

Furthermore, the present inventor had carried on similar experiments in a case where the gate electrode has a plurality of regular hexagonal shaped opening windows under the same conditions. When the regular hexagonal shaped opening window has two parallel sides which are apart from one another at a distance of 4.0 μm and when a gate electrode length is equal to 6.0 μm, a channel width has the maximum value (about 196 mm per 1 mm$^2$) and a normalized on-resistance $(A_C \cdot R_{ON})$ has the minimum value (about 0.167 mm$^2$; hereinafter this value will be called the minimum value of the normalized on-resistance $(A_C \cdot R_{ON})$ in the regular hexagonal shaped opening window).

Attention will be directed to a power semiconductor device comprising a plurality of conventional VDMOSFETs including a gate electrode in common which has polygonal shaped opening windows systematically arranged with each other where each conventional VDMOSFET has a constant channel length and a constant vertical base junction depth $X_{jb}$ of each base region. In the power semiconductor device comprising the conventional VDMOSFETs, the channel width per unit area widens when the gate electrode has the regular hexagonal shaped opening windows as disclosed in the above-mentioned U.S. Pat. No. 5,008,725. In this event, the normalized on-resistance $(A_C \cdot R_{ON})$ has the minimum value. That is, it is difficult for the power semiconductor device comprising the conventional VDMOSFETs to furthermore decrease the normalized on-resistance $(A_C \cdot R_{ON})$. As a result, the power semiconductor device comprising the conventional VDMOSFETs with a low breakdown voltage is disadvantageous in that it is difficult for each conventional VDMOSFET to improve switching speed and current density, as mentioned in the preamble of the instant specification.

Figure 5:
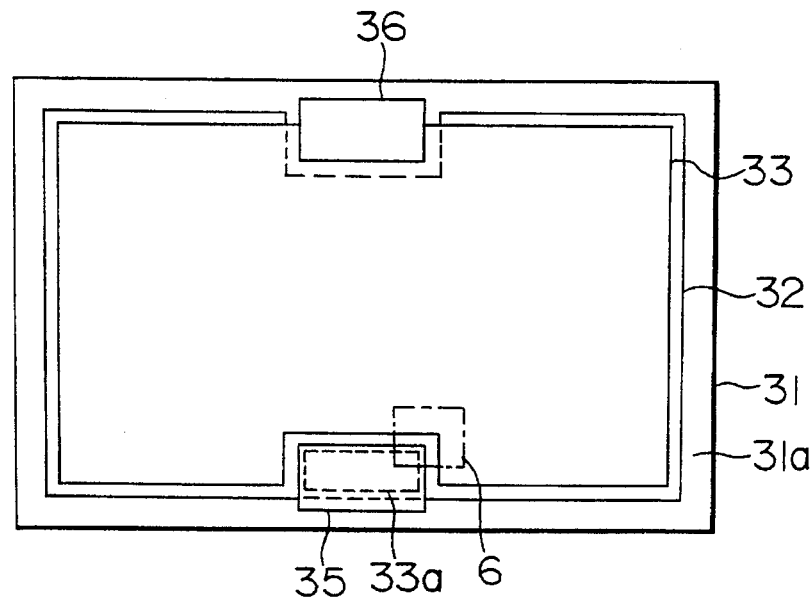
FIG. 5 is a schematic plane view showing a power semiconductor device according to a first embodiment of this invention.
Figure 6:
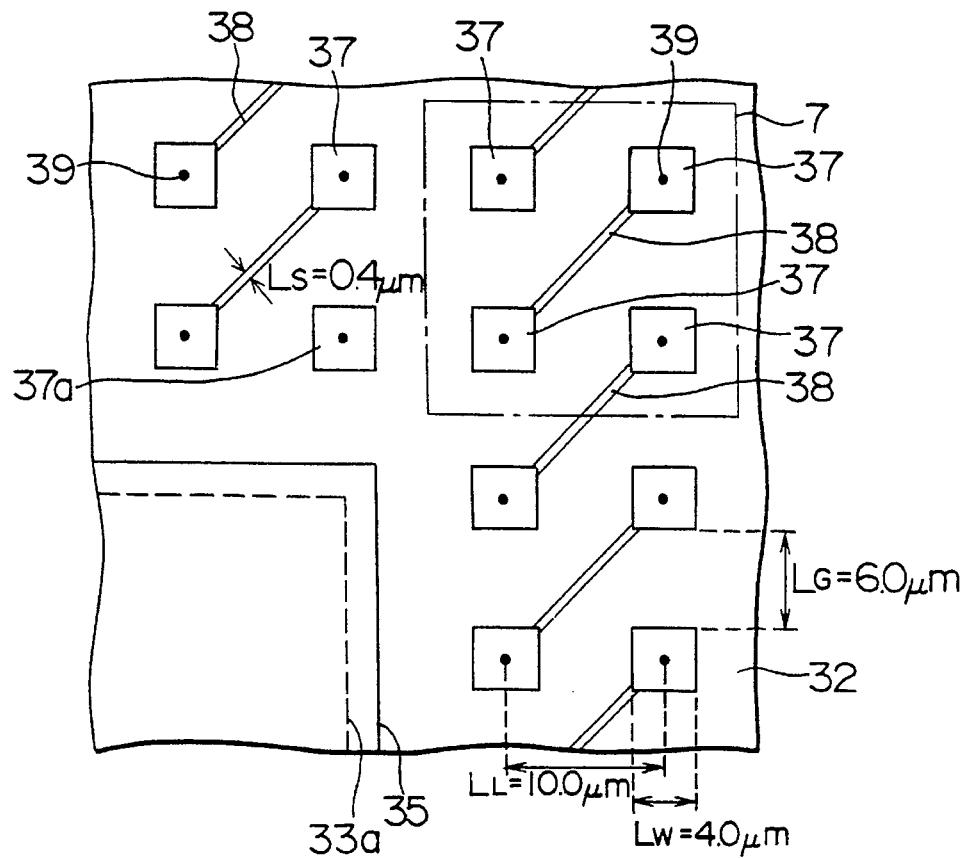
FIG. 6 is an expanded schematic plane view showing a rectangular region 6 enclosed with a dot-dash-line in FIG. 5.

Referring to FIGS. 5 and 6, the description will proceed to a power semiconductor device according to a first embodiment of this invention. FIG. 5 is a schematic plane view showing the power semiconductor device which comprises a plurality of VDMOSFETs. FIG. 6 is an expanded schematic plane view showing a rectangular region 6 enclosed with a dot-dash-line in FIG. 5.

As shown in FIG. 5, the illustrated power semiconductor device comprises a semiconductor chip 31 which is rectangular in configuration and which has a main or upper surface 31a and a bottom surface (not shown). A gate electrode 32 covers the greater part of the upper surface 31a of the semiconductor chip 31. A source electrode 33 substantially covers a surface of the gate electrode 32. The source electrode 33 has a contact hole 33a. The gate electrode 32 is electrically connected through the contact hole 33a to a gate bonding pad 35 which is disposed in a part of a peripheral portion in the semiconductor chip 32. A part of the source electrode 33 is electrically connected to a source bonding pad 36 which is disposed in another part of the peripheral portion in the semiconductor chip 32.

Turning to FIG. 6, the gate electrode 32 has a plurality of polygonal shaped opening windows such as opening windows 37 and 37a and a plurality of slit shaped opening windows 38. In the example being illustrated, each of the polygonal shaped opening windows 37 and 37a is square in shape having four sides each of which has a side length $L_W$ of 4.0 μm. Each of the slit shaped opening windows 38 has a width of a width length $L_S$ of 0.4 μm which is equal to the minimum processing size. Each of the square shaped opening windows 37 and 37a has a center positioned on each of lattice points 39 in a two-dimensional square lattice which has a lattice constant $L_L$ of 10.0 μm. Two adjacent square shaped opening windows 37 and 37a are apart from each other by a space which is equal to a gate electrode length $L_G$ of 6.0 μm. The lattice constant $L_L$ is therefore equal to a sum of the gate electrode length $L_G$ and the side length $L_W$, that is, $L_L=L_G+L_W$. Each slit shaped opening windows 38 is disposed between two oblique adjacent square shaped opening windows 37 with the two oblique adjacent square shaped opening windows 37 connected by the slit shaped opening window in question. In addition, there is the square shaped opening windows such as 37a disposed near the gate bonding pad 35 in the semiconductor chip 31 where the square shaped opening window 37a is not connected to any oblique adjacent square shaped opening window 37 through any slit shaped opening window 38 as shown in FIG. 6. In the example being illustrated, each of the slit shaped opening windows 38 is obliquely fallen toward left-hand side or risen up into right-hand side in FIG. 6. The slit shaped opening windows 38 may have another oblique direction.

Figure 7:
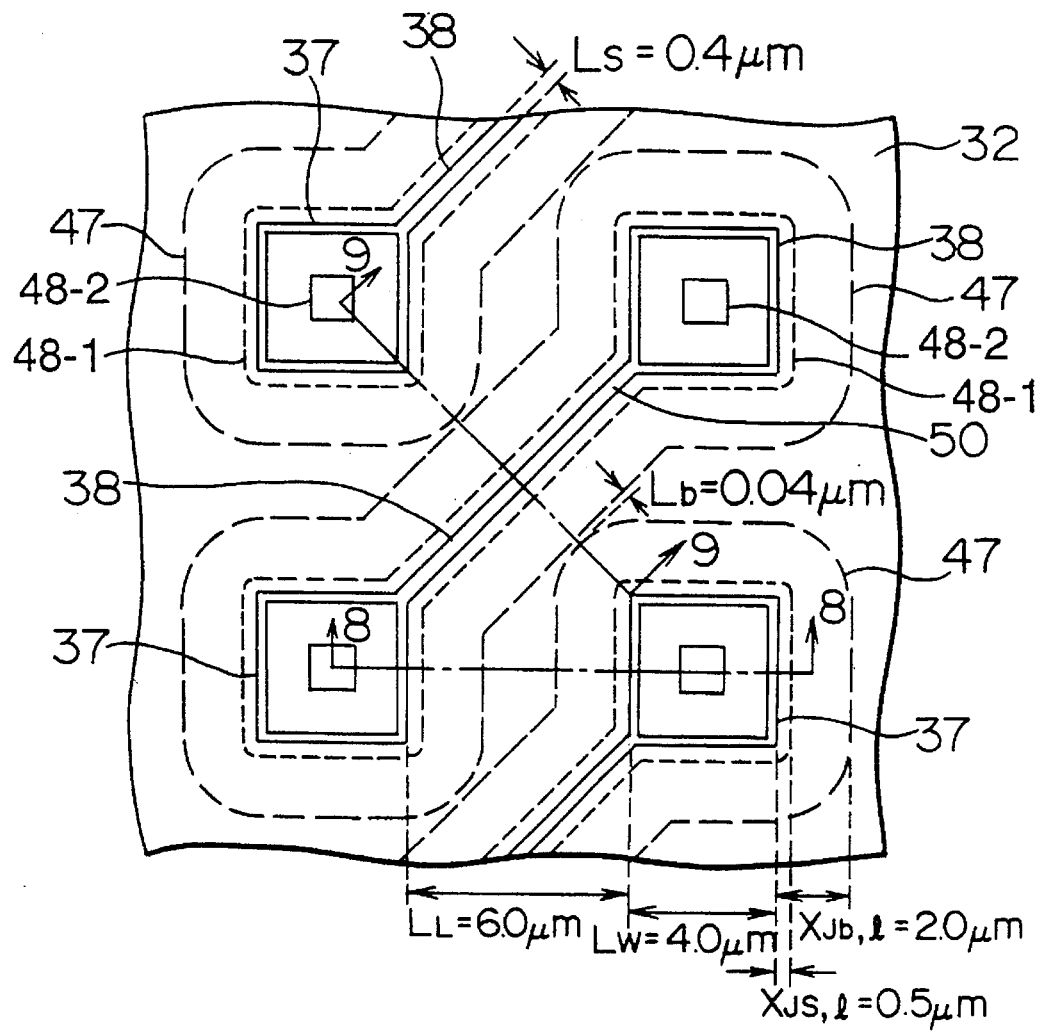
FIG. 7 is an expanded schematic plane view showing a rectangular region 7 enclosed with a dot-dash-line in FIG. 6.
Figure 8:
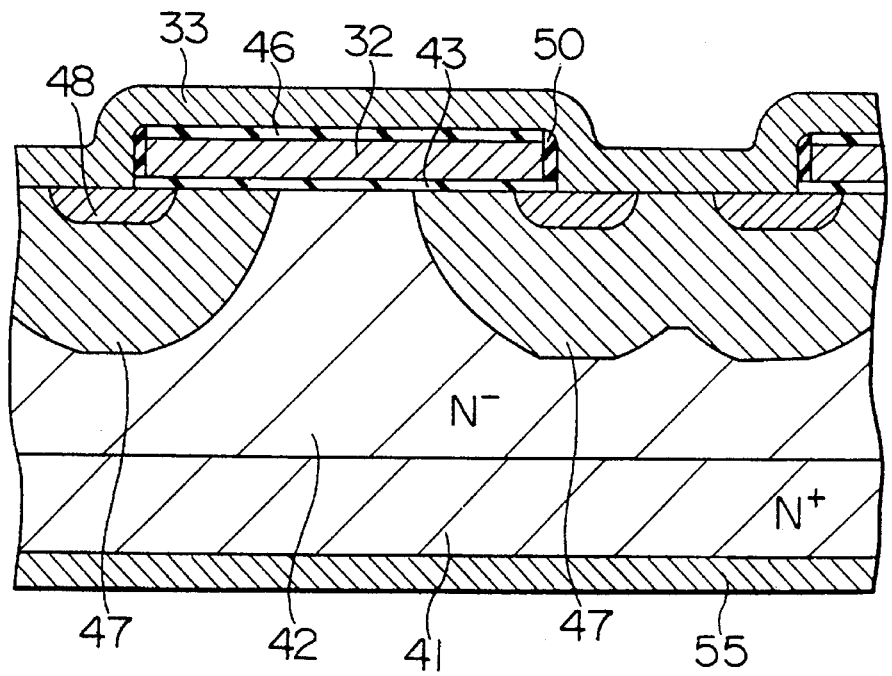
FIG. 8 shows a sectional view taken substantially along the lines 8—8 of FIG. 7.
Figure 9:
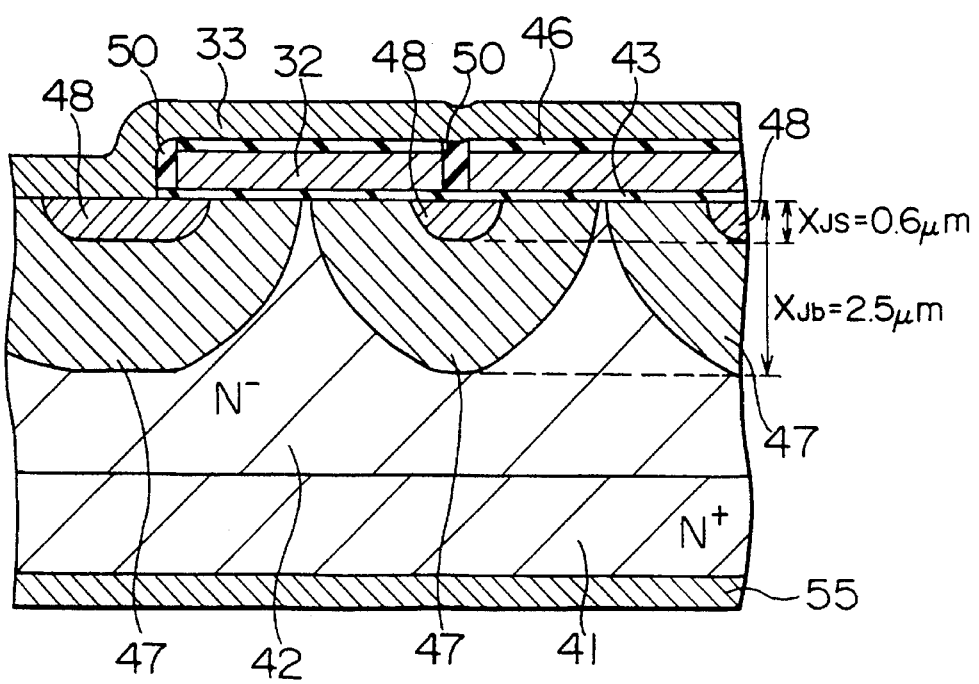
FIG. 9 shows a sectional view taken substantially along the lines 9—9 of FIG. 7.

Turning to FIGS. 7 to 9, the description will proceed to structure of a VDMOSFET included in the power semiconductor device illustrated in FIGS. 5 and 6. FIG. 7 is an expanded schematic plane view which shows a rectangular region 7 enclosed with a dot-dash-line in FIG. 6 and which shows layers beneath the gate electrode 32. FIG. 8 shows a sectional view taken substantially along the lines 8—8 of FIG. 7. FIG. 9 shows a sectional view taken substantially along the lines 9—9 of FIG. 7.

The illustrated VDMOSFET comprises an N⁺-type silicon (Si) substrate 41 which has a thickness of about 450 μm and an electrical resistivity of about 10 mΩ·cm. An N⁻-type epitaxial layer 42 is formed on an upper surface of the N⁺-type silicon (Si) substrate 41. The N⁻-type epitaxial layer 42 has a thickness of about 6.5 μm and an electrical resistivity of about 0.4 Ω·cm. A gate oxide film 43 and the gate electrode 32 are formed on a surface of the N⁻-type epitaxial layer 42 in this order. The gate oxide film 43 has a thickness of about 50 nm. The gate electrode 32 consists of an N⁺-type polysilicon film which has a thickness of about 400 nm. As described above, the gate electrode 32 has the plurality of square shaped opening windows 37 and 37a and the plurality of slit shaped opening windows 38 as shown in FIG. 7. A silicon oxide film 46 is formed on an upper surface of the gate electrode 32. The silicon oxide film 46 acts as a first insulation film and has a thickness of about 200 nm. Spacers 50 are formed on side walls of the gate electrode 32 or edge portions of both of the square shaped opening windows 37 and 37a and the slit shaped opening windows 38. Each of the spacers 50 consists of a silicon oxide film which has a thickness of about 200 nm. The spacers 50 are buried in the slit shaped opening windows 38. This is because each of the slit shaped opening windows 38 has the width of the width length $L_S$ of 0.4 μm.

A plurality of P⁺-type base regions 47 are formed beneath a surface of the N⁻-type epitaxial layer 42 with each P⁺-type base region 47 self-aligned to one slit shaped opening window 38 and two square shaped opening windows 37 between which the slit shaped opening window 38 in question connects. That is, each P⁺-type base region 47 is dumbbell in shape. Each of the P⁺-type base regions 47 has a vertical base junction depth $X_{jb}$ as shown in FIG. 9 and a horizontal base junction depth $X_{jb,1}$ beneath the gate electrode 32 as shown in FIG. 7. In the example being illustrated, the vertical base junction depth $X_{jb}$ is equal to 2.5 μm, namely, $X_{jb}$=2.5 μm and the horizontal base junction depth $X_{jb,1}$ is equal to about 2.0 μm, namely, $X_{jb,1}$≈2.0 μm. Two adjacent P⁺-type base regions 47 are apart from one another by a space which is limited to the minimum space $L_b$ of about 0.04 μm. A portion where the space between the two adjacent P⁺-type base regions 47 has the minimum space $L_b$ exists in a part between the P⁺-type base regions 47 self-aligned to a particular one of the square shaped opening windows 37 and the P⁺-type base regions 47 self-aligned to a specific one of the slit shaped opening window 38 that is exceedingly adjacent to the particular square shaped opening window 37 and that is not connected to the particular square shaped opening window 37.

A plurality of N⁺-type source regions 48 are formed beneath surfaces of the P⁺-type base regions 47. Each of the N⁺-type source regions 48 has an outer edge 48-1 which is self-aligned to a particular one of the slit shaped opening windows 38 and which is self-aligned to two square shaped opening windows 37 connected through the particular slit shaped opening window 38. In addition, each of the N⁺-type source regions 48 has another ends which are apart from edges of the above-mentioned two square shaped opening windows 37 by a constant width. That is, each of the N⁺-type source regions 48 is box end wrench in shape. The constant width is equal, for example, to 1.5 μm. In a central portion of each of the square shaped opening windows 37 and 37a, each of the P⁺-type base regions 47 has a partial surface which is exposed therein and which has a constant area. The constant area is equal, for example, to 1 μm² Each of the N⁺-type source regions 48 has a vertical source junction depth $X_{js}$ as shown in FIG. 9 and a horizontal source junction depth $X_{js,1}$ beneath the gate electrode 32 as shown in FIG. 7. In the example being illustrated, the vertical source junction depth $X_{js}$ is equal to 0.6 μm, namely, $X_{js}$=0.6 μm. The horizontal source junction depth $X_{js,1}$ is substantially equal to 0.5 μm, namely, $X_{js,1}$≈0.5 μm.

As shown in FIGS. 8 and 9, the silicon oxide film 46 and the spacers 50 are covered by the source electrode 33 which consists of an alloy film composed of a composition of aluminum (Al), silicon (Si), and chlorine (Cl). The source electrode 33 is directly and electrically connected to both of the P⁺-type base regions 47 and the N⁺-type source regions 48 through the square shaped opening windows 37 as contact holes. A drain electrode 55 is formed on the bottom surface of the N⁺-type silicon substrate 41. The drain electrode 55 consists of a metal film.

With this structure, each VDMOSFET has a normalized on-resistance $(A_C·R_{ON})$ of about 0.147 mm²·Ω, namely, $(A_C·R_{ON})$≈0.147 mm²·Ω. The normalized on-resistance $(A_C·R_{ON})$ in this embodiment is smaller than the minimum value (about 0.171 mm²·Ω) of the normalized on-resistance $(A_C·R_{ON})$ in the conventional VDMOSFET having the square shaped opening window as illustrated in FIG. 1. In addition, the normalized on-resistance $(A_C·R_{ON})$ in this embodiment is smaller than the minimum value (about 0.167 mm²·Ω) of the normalized on-resistance $(A_C·R_{ON})$ in the conventional VDMOSFET having the hexagonal shaped opening window as disclosed in the above-mentioned U.S. Pat. No. 5,008,725. Accordingly, in comparison with the power semiconductor devices comprising the conventional VDMOSFETs, it is possible for the power semiconductor device comprising the VDMOSFETs according to this embodiment to improve switching speed and current density thereof. The normalized on-resistance ($A_C \cdot R_{ON}$) for this embodiment decreases because the gate electrode 32 has not only the polygonal (square) shaped opening windows 37 but also the slit shaped opening windows 38. In addition, each of the polygonal shaped opening windows 37 and 37a has the side length $L_W$ of 4.0 μm but the side length $L_W$ may have other values.

Referring to FIGS. 10A to 10D, the description will be made as regards a method of fabricating the power semiconductor device illustrated in FIGS. 5 to 9. Each of FIGS. 10A to 10D shows a sectional view taken substantially along the lines 8—8 of FIG. 7. The illustrated fabricating method is 0.4 μm process with the minimum processing size of 0.4 μm and with alignment accuracy of ±0.05 μm.

Figure 10A:
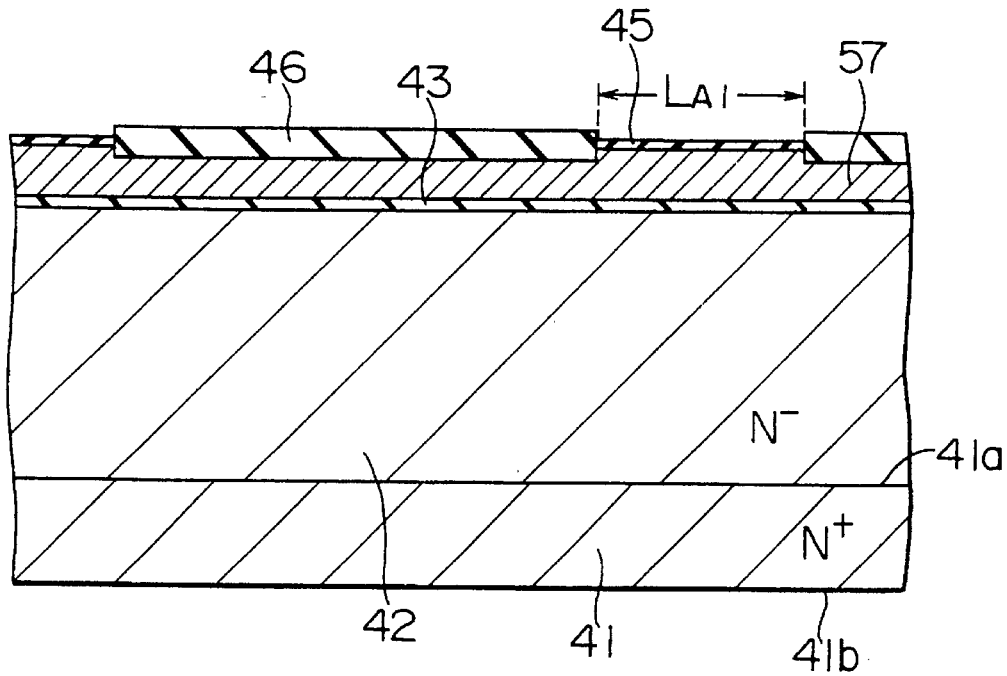
FIGS. 10A to 10D illustrate the fabricating process sequence of the power semiconductor device illustrated in FIGS. 5 to 9.

As shown in FIGS. 10A, the N$^+$-type silicon substrate 41 is prepared in a known manner and has the upper surface 41a and the bottom surface 41b which are directed upwards and downwards of FIG. 10A. The N$^-$-type epitaxial layer 42 is formed on the upper surface 41a of the N$^+$-type silicon substrate 41. The gate oxide film 43 is formed on the surface of the N$^-$-type epitaxial layer 42 by thermal oxidation. An N$^+$-type polysilicon film 57 is formed on the surface of the gate oxide film 43 by the chemical vapor deposition (CVD) process, the diffusion process, or the like. The N$^+$-type polysilicon film 57 has a thickness of about 600 nm. A silicon nitride film 45 having a predetermined thickness is formed on a surface of the N$^+$-type polysilicon film 57 by the CVD process. The silicon nitride film 45 is removed from the N$^+$-type polysilicon film 57 without an area on which the square shaped opening windows 37 and 37a (FIG. 6) and the slit shaped opening windows 38 (FIG. 6) should be formed. As a result, for example, at the area on which the square shaped opening windows 37 should be formed, the silicon nitride film 45 remains with a width $L_{A1}$ which is equal to the side length $L_W$ of 4.0 μm, namely, $L_{A1}=L_W=4.0$ μm. The silicon oxide film 46 is formed on the surface of the N$^+$-type polysilicon film 57 where the silicon nitride film 45 is removed. The silicon oxide film 46 has a thickness of about 400 nm. The N$^+$-type polysilicon film 57 has a thickness of about 400 nm beneath the silicon oxide film 46.

Figure 10B:
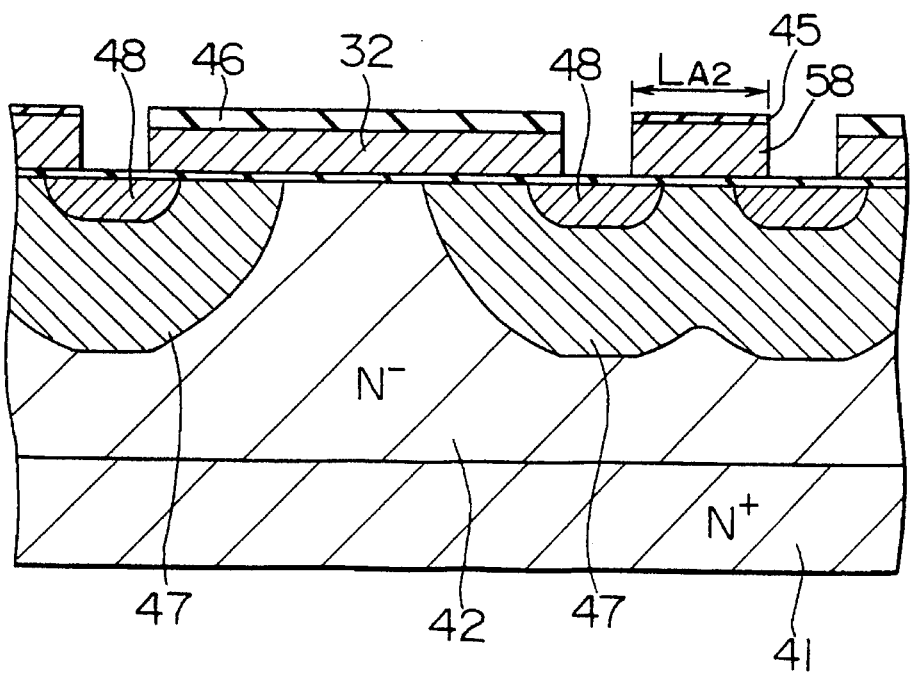

Referring to FIGS. 10B in addition to FIG. 10A, a photo resist film (not shown) is formed on the silicon oxide film 46 and the silicon nitride film 45. The photo resist film has openings corresponding to areas where the slit shaped opening windows 38 (FIG. 6) should be formed and which have a width of ($L_{A1}+L_{A2}$)/2 apart from edges of the square shaped opening windows 37 and 37a to inside in which the square shaped opening windows 37 and 37a should be formed. The silicon nitride film 45 and the N$^+$-type polysilicon film 57 are removed by dry etching using the photo resist film as a mask. As a result, the gate electrode 32, the slit shaped opening windows 38, and N$^+$-type polysilicon films 58 are formed on the gate oxide film 43. Each of the N$^+$-type polysilicon films 58 is square in configuration which has four sides each having a length $L_{A2}$. Each of the N$^+$-type polysilicon films 58 serves as a mask for ion implantation. It is necessary to form exposed portions of the P$^+$-type base region 47 beneath parts of the N$^+$-type polysilicon films 58. As a result, the length $L_{A2}$ must have relation to both of the horizontal base junction depth $X_{jb,1}$ (FIG. 7) and the horizontal source junction depth $X_{js,1}$ (FIG. 7) as follows:

$$2X_{jb,1} > L_{Aw} > 2X_{js,1}.$$

In the example being illustrated, the length $L_{A2}$ is equal to 2.0 μm, namely, $L_{A2}=2.0$ μm. After removal of the photo resist film, a part of the gate oxide film 43 corresponding to the openings is removed by wet etching. In FIG. 10B, the gate oxide film 43 is illustrated with no removal in order to avoid complication of drawing. In this step, the silicon oxide film 46 has a thickness of about 300 nm. Another silicon oxide film (not shown) having a thickness of about 10 nm is formed by thermal oxidation on exposed surfaces of the N$^-$-type epitaxial layer 102, the gate electrode 32, and the N$^+$-type polysilicon film 58. Inasmuch as the length $L_{A2}$ is satisfied with the above-mentioned condition, exposed portions for the P$^+$-type base region are formed beneath the N$^+$-type polysilicon films 58. Ion implantation of boron (B) is made under the condition of acceleration energy of 70 keV and of ion density of 5×10 cm$^{-2}$ and thereafter thermal treatment is carried out at temperature 1140° C. for 120 minutes, thereby the P$^+$-type base regions 47 are formed. Each of the P$^+$-type base regions 47 has the vertical base junction depth $X_{jb}$ of 2.5 μm and the horizontal base junction depth $X_{jb,1}$ of about 2.0 μm ($X_{jb}=2.5$ μm, $X_{jb,1}\approx 2.0$ μm). Subsequently, ion implantation of arsenic (As) is made under the condition of acceleration energy of 70 keV and of ion density of 1×10$^{16}$ cm$^{-2}$ and thereafter thermal treatment is carried out at temperature 1000° C., thereby the N$^+$-type source regions 48 are formed. Each of the N$^+$-type source regions 48 has the vertical source junction depth $X_{js}$ of 0.6 μm and the horizontal source junction depth $X_{js,1}$ of about 0.5 μm ($X_{js}=0.6$ μm, $X_{js,1}\approx 0.5$ μm). Inasmuch as the length $L_{A2}$ is satisfied with the above-mentioned condition, there is portions without the N$^+$-type source regions 48 beneath the N$^+$-type polysilicon films 58.

Figure 10C:
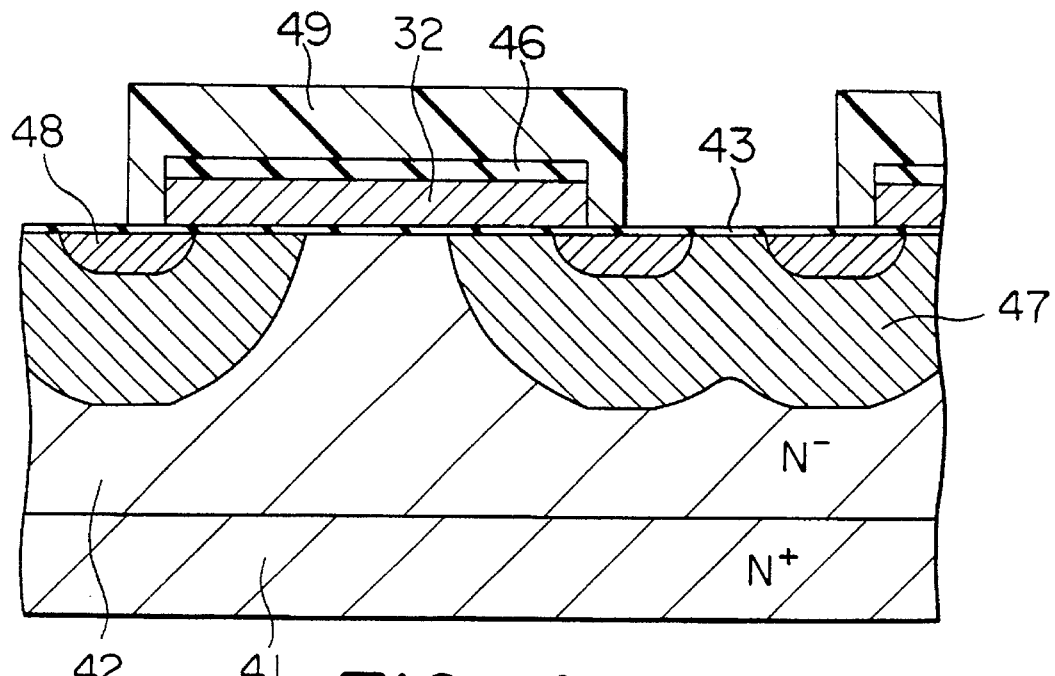

Referring to FIGS. 10C in addition to FIG. 10B, the silicon nitride films 45, which remain on the N$^+$-type polysilicon films 58, is removed by wet etching. A photo resist film 59 is formed. The photo resist film 49 has openings so that the N$^+$-type polysilicon films 58 are exposed. The N$^+$-type polysilicon films 58 are removed by etching using the photo resist film 49 as a mask. The gate oxide film 43 may be removed by wet etching using the photo resist film 49 as a mask.

Figure 10D:
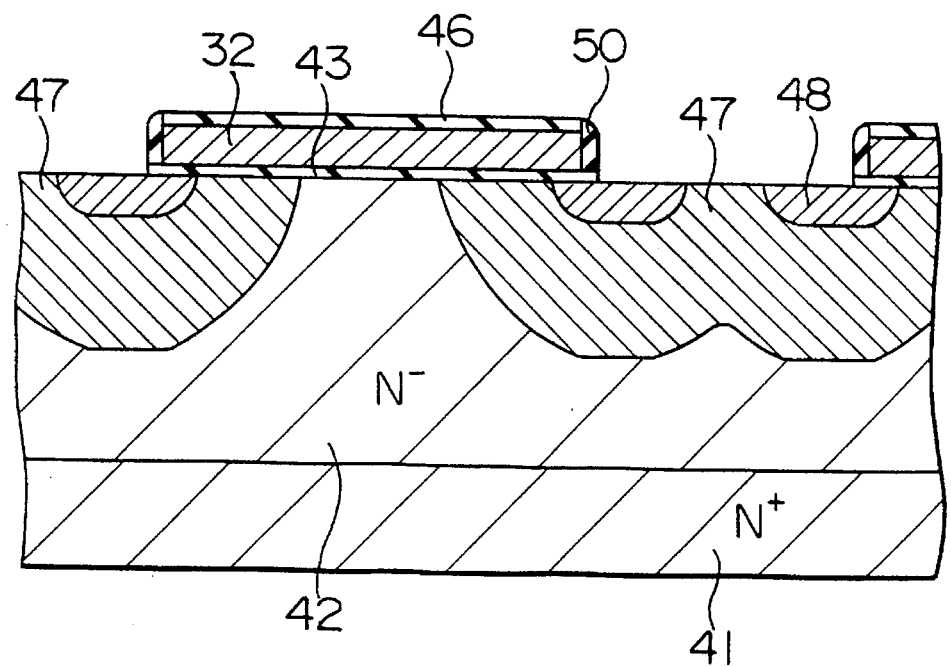

Referring to FIG. 10D in addition to FIG. 10C, after removal of the photo resist film 49, the gate oxide film 43 (and the silicon oxide film which is formed on exposed surfaces of the N$^-$-type epitaxial layer 42, the gate electrode 32 and the N$^+$-type polysilicon film 58) are removed by wet etching, thereby the square shaped opening windows 37 and 37a (FIG. 6) are formed in the gate electrode 32. In this step, the silicon oxide film 46 becomes thin and has a thickness of about 200 nm. A silicon oxide film (not shown) having a thickness of about 200 nm is deposited on an entire surface by the CVD process. The silicon oxide film is etched back, thereby the spaces 50 having a thickness of about 200 nm are formed on side walls of the gate electrode 32 as shown in FIG. 10D.

Subsequently, the source electrode 33 and the drain electrode 55 are formed as shown in FIG. 8, thereby the VDMOSFET is fabricated.

In the power semiconductor device according to the first embodiment, almost all the VDMOSFETs are fabricated using two square shaped opening windows 37 and one slit shaped opening window 38 as shown in FIG. 7, but a few of the VDMOSFETs are fabricated using only one square shaped opening window 37s as shown in FIG. 6. In order to clarify description which will later be described, it is assumed that two virtual VDMOSFETs are fabricated using two square shaped opening windows 37 and one slit shaped opening window 38. Under the circumstances, one virtual VDMOSFET is fabricated using one square shaped opening window 37. The virtual VDMOSFET is referred to as a virtual cell transistor. The virtual cell transistor has a virtual size which is defined by an occupied area of one square shaped opening window 37. In the example being illustrated, the virtual size is equal to $L_L^2$ of 100 µm². By providing the slit shaped opening windows 38, one virtual cell transistor has a channel width which is wider by about 6×2$^{0.5}$ µm than that of a conventional cell transistor using one square shaped opening window having the minimum value of the normalized on-resistance ($A_C \cdot R_{ON}$). Accordingly, in the first embodiment, an apparent channel width per 1 mm² is about 278 µm. By calculating back on the normalized on-resistance ($A_C \cdot R_{ON}$) according to the first embodiment, an effective channel width per 1 mm² is substantially equal to 222 mm. A contributory rate, which indicates an increasing rate of the apparent channel versus the effective channel width, is about 37%. In order to furthermore increase the contributory rate, it is necessary to widen the minimum interval $L_b$ between two adjacent P⁺-type base regions 47.

Figure 11:
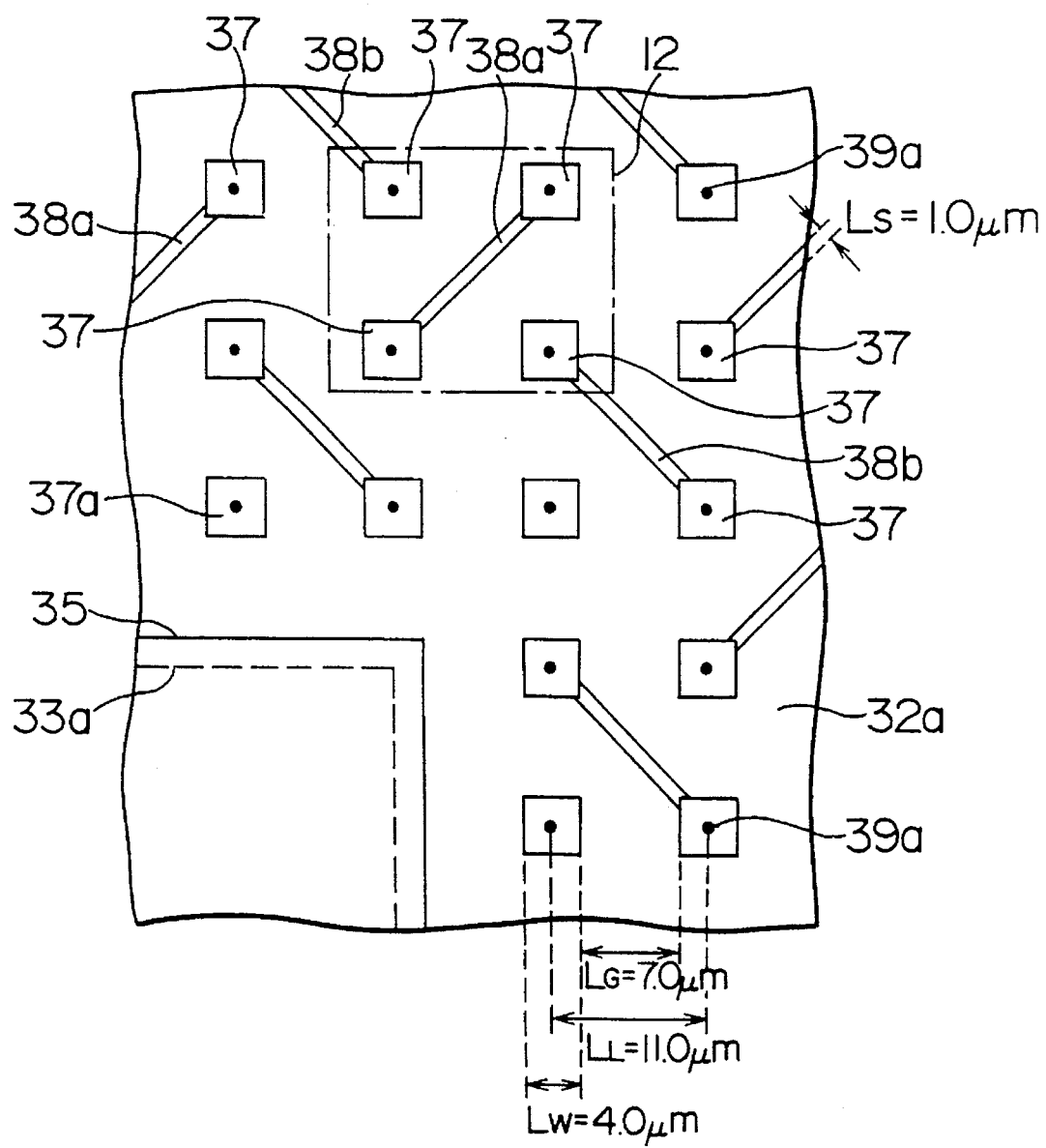
FIG. 11 is a schematic plane view showing a power semiconductor device according to a second embodiment of this invention and is an expanded schematic plane view showing a rectangular region 6 enclosed with the dot-dash-line in FIG. 5.

Referring to FIG. 11, the description will proceed to a power semiconductor device according to a second embodiment of this invention. FIG. 11 is an expanded schematic plan view showing the rectangular region 6 enclosed with the dot-dash-line in FIG. 5. The illustrated power semiconductor device comprises a semiconductor chip (not shown) similar to that illustrated in FIG. 5 except that the gate electrode 32 is modified into a gate electrode 32a. The gate electrode 32a covers the greater part of an upper surface of the semiconductor chip like as 31 (FIG. 5). A source electrode (not shown) substantially covers a surface of the gate electrode 32a. The source electrode has the contact hole 33a. The gate electrode 32a is electrically connected through the contact hole 33a to the gate bonding pad 35 which is disposed in a part of a peripheral portion in the semiconductor chip. A part of the source electrode is electrically connected to a source bonding pad (not shown) which is disposed in another part of the peripheral portion in the semiconductor chip.

The gate electrode 32a has a plurality of square shaped opening windows such as opening windows 37 and 37a and a plurality of slit shaped opening windows 38a and 38b. In the example being illustrated, each of the square shaped opening windows 37 and 37a has four sides each of which has a side length $L_W$ of 4.0 µm, namely, $L_W$=4.0 µm. Each of the slip shaped opening windows 38a and 38b has a slit width $L_S$ of 1.0 µm, namely, $L_S$=1.0 µm. Each of the square shaped opening windows 37 and 37a has a center positioned on each of lattice points 39 in a two-dimensional square lattice which has a lattice constant $L_L$ of 11.0 µm. Two adjacent square shaped opening windows 37 and 37a are apart from each other by a space which is equal to a gate electrode length $L_G$ of 7.0 µm. Substantial differences between the second embodiment and the first embodiment are as follows. At first, the power semiconductor device according to the second embodiment has a cell size $L_L$ of 121 µm by lengthening the gate electrode length $L_G$ to 7.0 µm. At second, in the power semiconductor device according to the second embodiment, the slit width $L_S$ of the slit shaped opening windows 38a and 38b is widened to 1.0 µm.

Each of the slit shaped opening windows 38a and 38b is disposed between two oblique adjacent square shaped opening windows 37 with the two oblique adjacent square shaped opening windows 37 connected by the slit shaped opening window in question. In addition, there is the square shaped opening windows such as 37a disposed near the gate bonding pad 35 where the square shaped opening windows 37a are not connected to any oblique adjacent square shaped opening window 37 through any slit shaped opening window 38 as shown in FIG. 11. In the example being illustrated, each of the slit shaped opening windows 38a is obliquely fallen toward left-hand side or risen up into right-hand side in FIG. 11. On the other hand, each of the slit shaped opening windows 38b is obliquely fallen toward right-hand side or risen up into left-hand side in FIG. 11.

Figure 12:
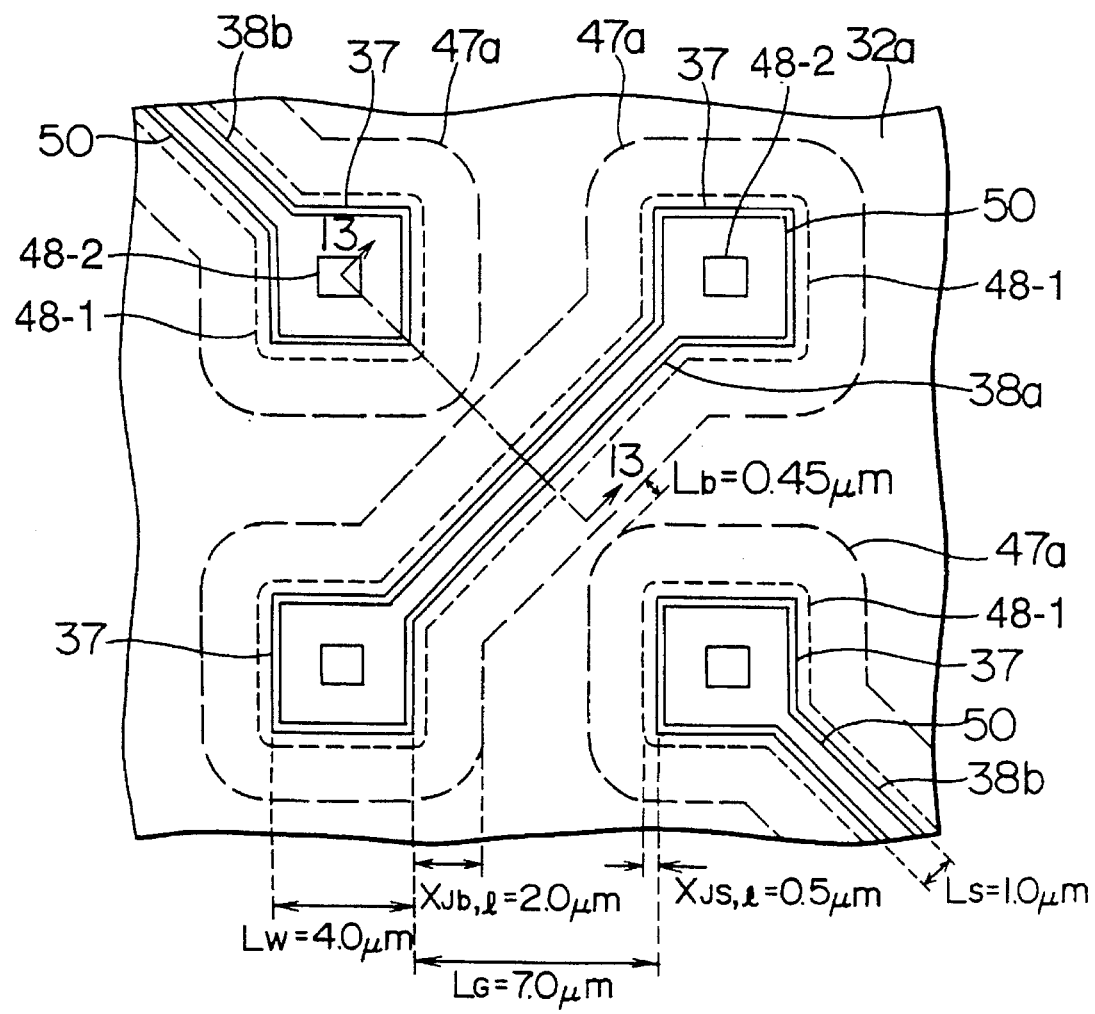
FIG. 12 is an expanded schematic plane view showing a rectangular region 12 enclosed with a dot-dash-line in FIG. 11.
Figure 13:
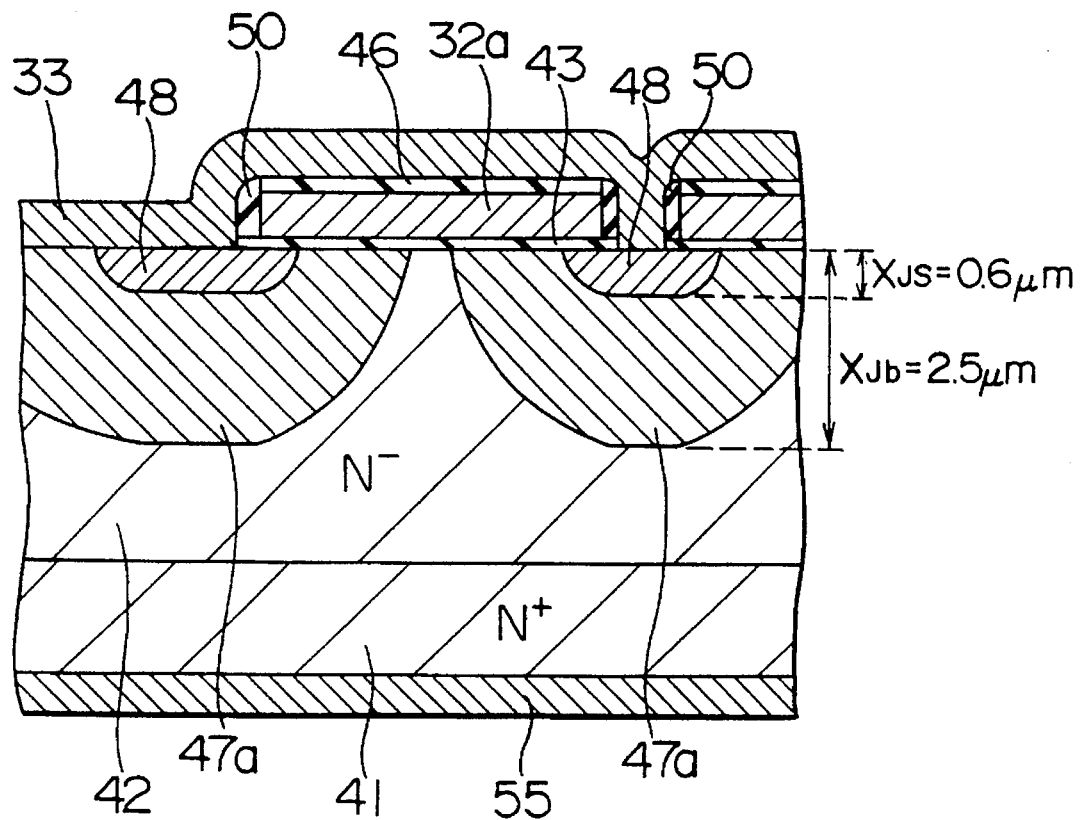
FIG. 13 shows a sectional view taken substantially along the lines 13—13 of FIG. 12.

Turning to FIGS. 12 to 13, the description will proceed to structure of a VDMOSFET included in the power semiconductor device illustrated in FIG. 11. FIG. 12 is an expanded schematic plan view which shows a rectangular region 12 enclosed with a dot-dash-line in FIG. 11 and which shows layers beneath the gate electrode 32a. FIG. 13 shows a sectional view taken substantially along the lines 13—13 of FIG. 12.

The illustrated VDMOSFET comprises the N⁺-type silicon (Si) substrate 41. The N⁻-type epitaxial layer 42 is formed on the upper surface of the N⁺-type silicon (Si) substrate 41. The gate oxide film 43 and the gate electrode 32a are formed on the surface of the N⁻-type epitaxial layer 42 in this order. The gate oxide film 43 has a thickness of about 50 nm. The gate electrode 32a consists of an N⁺-type polysilicon film. As described above, the gate electrode 32a has the plurality of square shaped opening windows 37 and 37a and the plurality of slit shaped opening windows 38a and 38b as shown in FIG. 11. The silicon oxide film 46 is formed on an upper surface of the gate electrode 32a. The silicon oxide film 46 acts as a first insulation film. The spacers 50 are formed on side surfaces of the gate electrode 32a or edge portions of both of the square shaped opening windows 37 and 37a and the slit shaped opening windows 38a and 38b. Each of the spacers 50 consists of a silicon oxide film which serves as a second insulation film. The N⁺-type source regions 48 expose in the slit shaped opening windows 38a and 38b. This is because the slit shaped opening windows 38a and 38b have a slit width $L_S$ of 1.0 µm.

A plurality of P⁺-type base regions 47a are formed beneath the surface of the N⁻-type epitaxial layer 42 with each P⁺-type base region 47a self-aligned to one of the slit shaped opening windows 38a and 38b and to two square shaped opening windows 37 between which the slit shaped opening window in question connects. Each of the P⁺-type base regions 47a has the vertical base junction depth $X_{jb}$ as shown in FIG. 13, and the horizontal base junction depth $X_{jb,1}$ beneath the gate electrode 32a as shown in FIG. 12. In the example being illustrated, the vertical base junction depth $X_{jb}$ is equal to 2.5 µm, namely, $X_{jb}$=2.5 µm and the horizontal base junction depth $X_{jb,1}$ is substantially equal to about 2.0 µm, namely, $X_{jb,1}$≈2.0 µm. Two adjacent P⁺-type base regions 47a are apart from one another by a space which is limited to the minimum interval $L_b$ of about 0.45 µm as shown in FIG. 12.

The plurality of N⁺-type source regions 48 are formed beneath the surfaces of the P⁺-type base regions 47a. Each of the N⁺-type source regions 48 has the vertical source junction depth $X_{js}$ as shown in FIG. 13 and the horizontal source junction depth $X_{js,1}$ beneath the gate electrode 32a as shown in FIG. 12. In the example being illustrated, the vertical source junction depth $X_{js}$ is equal to 0.6 µm, namely, $X_{js}$=0.6 µm. The horizontal source junction depth $X_{js,1}$ is substantially equal to 0.5 µm, namely, $X_{js,1}$≈0.5 µm.

As shown in FIG. 13, the silicon oxide film 46 and the spacers 50 are covered by the source electrode 33 which consists of an alloy film composed of composition of aluminum (Al), silicon (Si), and chlorine (Cl). The source electrode 33 is directly and electrically connected to both of the P$^+$-type base regions 47 and the N$^+$-type source regions 48 through the square shaped opening windows 37 and 37a and the slit shaped opening windows 38a and 38b as contact holes. The drain electrode 55 is formed on the bottom surface of the N$^+$-type silicon substrate 41. The drain electrode 49 consists of a metal film.

With this structure, each VDMOSFET has a normalized on-resistance ($A_C \cdot R_{ON}$) of about 0.143 mm$^2 \cdot \Omega$, namely, ($A_C \cdot R_{ON}$)≈0.143 mm$^2 \cdot \Omega$. The normalized on-resistance ($A_C \cdot R_{ON}$) in the second embodiment is smaller than that in the above-mentioned first embodiment. By lengthening the gate electrode length $L_G$, one virtual cell transistor has a channel width which is wider by about 7×2$^{0.5}$ µm than that of the conventional cell transistor using one square shaped opening window having the minimum value of the normalized on-resistance ($A_C \cdot R_{ON}$). However, inasmuch as the virtual cell transistor in the second embodiment has a cell size which is wider than that of the virtual cell transistor in the first embodiment, the virtual cell transistor in the second embodiment has an apparent channel width per 1 mm$^2$ which is about 242 µm and which is narrower than that of the virtual cell transistor in the first embodiment. By calculating back on the normalized on-resistance ($A_C \cdot R_{ON}$) according to the second embodiment, an effective channel width per 1 mm$^2$ is substantially equal to 228 mm. A contributory rate, which indicates an increasing rate of the apparent channel versus the effective channel width, is about 76%. The virtual cell transistor in the second embodiment has a higher contributory rate than the cell transistor in the first embodiment. This is because the minimum interval $L_b$ between two adjacent P$^+$-type base regions 47 widens. In addition, the semiconductor device according to the second embodiment has the gate electrode length $L_G$ of 7 µm and the slit width $L_S$ of 1.0 µm but the gate electrode length and the slit width $L_S$ may have other values.

Figure 14:
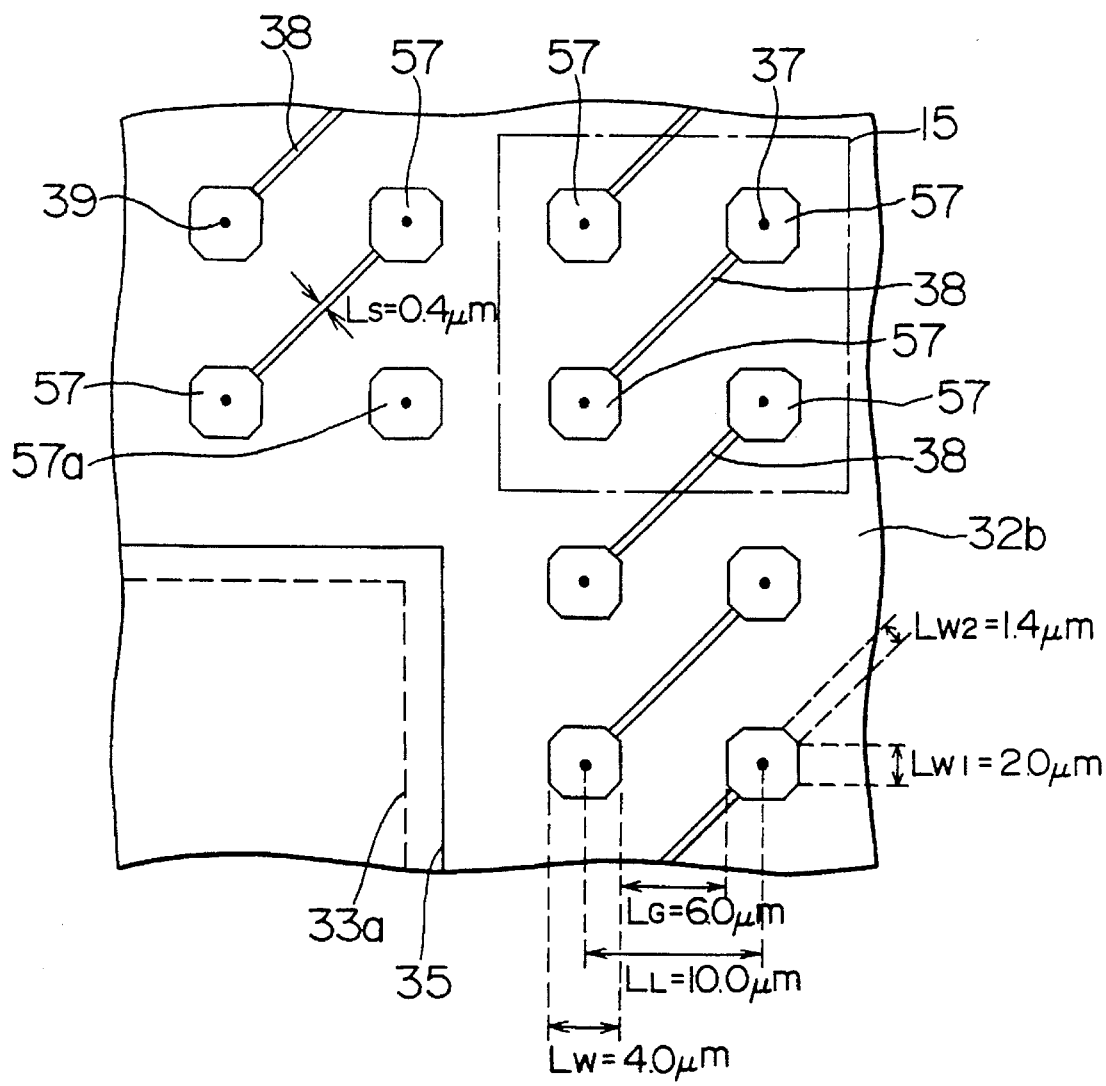
FIG. 14 is a schematic plane view showing a power semiconductor device according to a third embodiment of this invention and is an expanded schematic plane view showing a rectangular region 6 enclosed with the dot-dash-line in FIG. 5.

Referring to FIG. 14, the description will proceed to a power semiconductor device according to a third embodiment of this invention. FIG. 14 is an expanded schematic plan view showing the rectangular region 6 enclosed with the dot-dash-line in FIG. 5. The illustrated power semiconductor device comprises a semiconductor chip (not shown) similar to that illustrated in FIG. 5 except that the gate electrode 32 is modified into a gate electrode 32b. The gate electrode 32b covers the greater part of an upper surface of the semiconductor chip like as 31 (FIG. 5). A source electrode (not shown) substantially covers a surface of the gate electrode 32b. The source electrode has the contact hole 33a. The gate electrode 32a is electrically connected through the contact hole 33a to the gate bonding pad 35 which is disposed in a part of a peripheral portion in the semiconductor chip. A part of the source electrode is electrically connected to a source bonding pad (not shown) which is disposed in another part of the peripheral portion in the semiconductor chip.

The gate electrode 32b has a plurality of octagonal shaped opening windows such as opening windows 57 and 57a and the plurality of slit shaped opening windows 38. In the example being illustrated, each of the octagonal shaped opening windows 37 and 37a has two pairs of long sides and two pairs of short sides. Each pair of long sides are opposite to one another by a distance $L_W$ of 4.0 µm while each pair of short sides are opposite to one another. Each long side has a long side length $L_{W1}$ of 2.0 µm while each short side has a short side length $L_{W2}$ of 1.4 µm. Each of the slit shaped opening windows 38 has the slit width $L_S$ of 0.4 µm. Each of the octagonal shaped opening windows 57 and 57a has a center positioned on each of lattice points 39 in a two-dimensional square lattice which has the lattice constant $L_L$ of 10.0 µm. Two adjacent octagonal shaped opening windows 57 and 57a are apart from each other by a space which is equal to a gate electrode length $L_G$ of 6.0 µm. A substantial difference between the third embodiment and the first embodiment is as follows. The power semiconductor device according to the third embodiment has the octagonal shaped opening windows 57 and 57a which are different from the square shaped opening windows 37 and 37a in the power semiconductor device according to the first embodiment.

Figure 15:
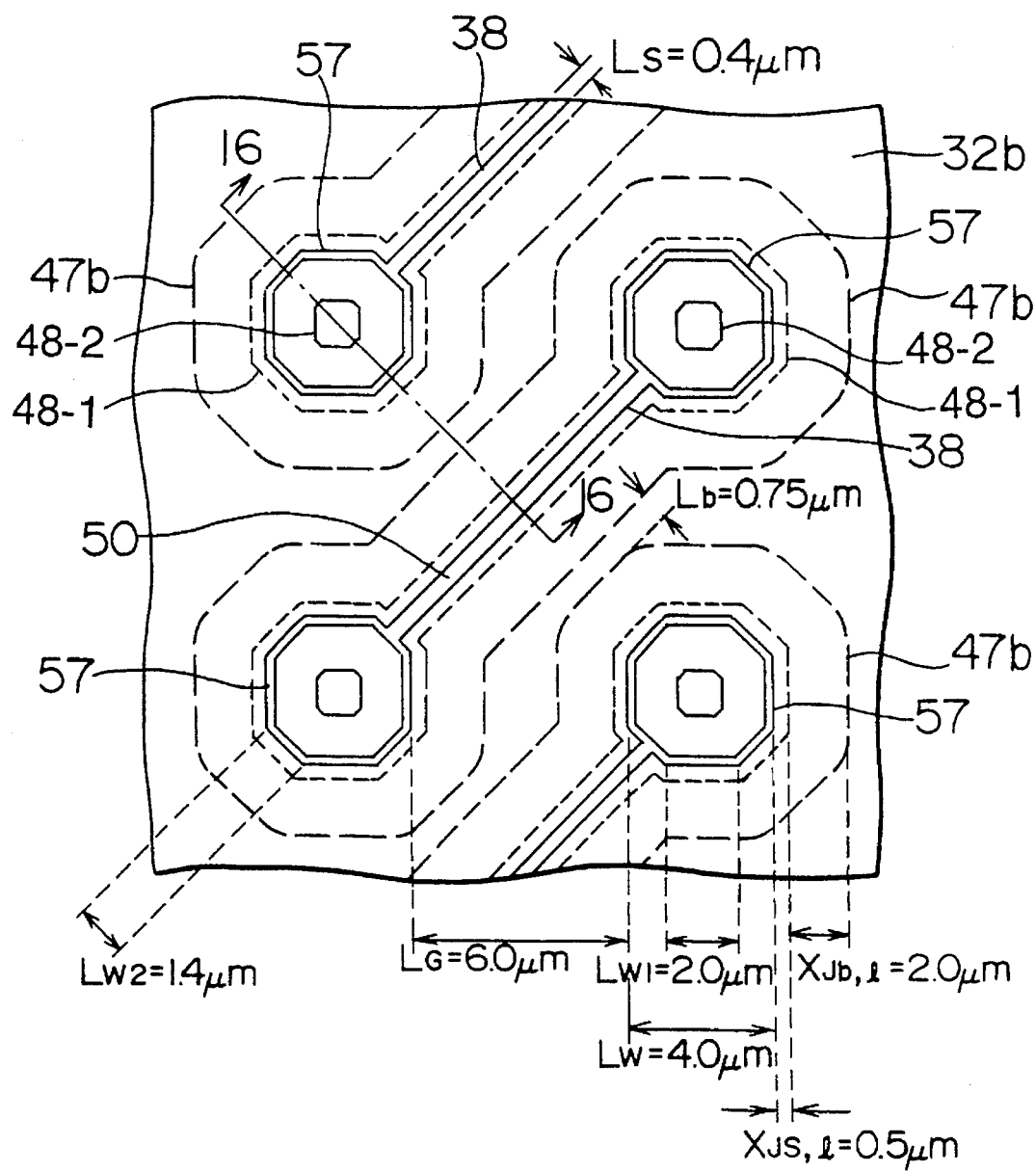
FIG. 15 is an expanded schematic plane view showing a rectangular region 15 enclosed with a dot-dash-line in FIG. 14.
Figure 16:
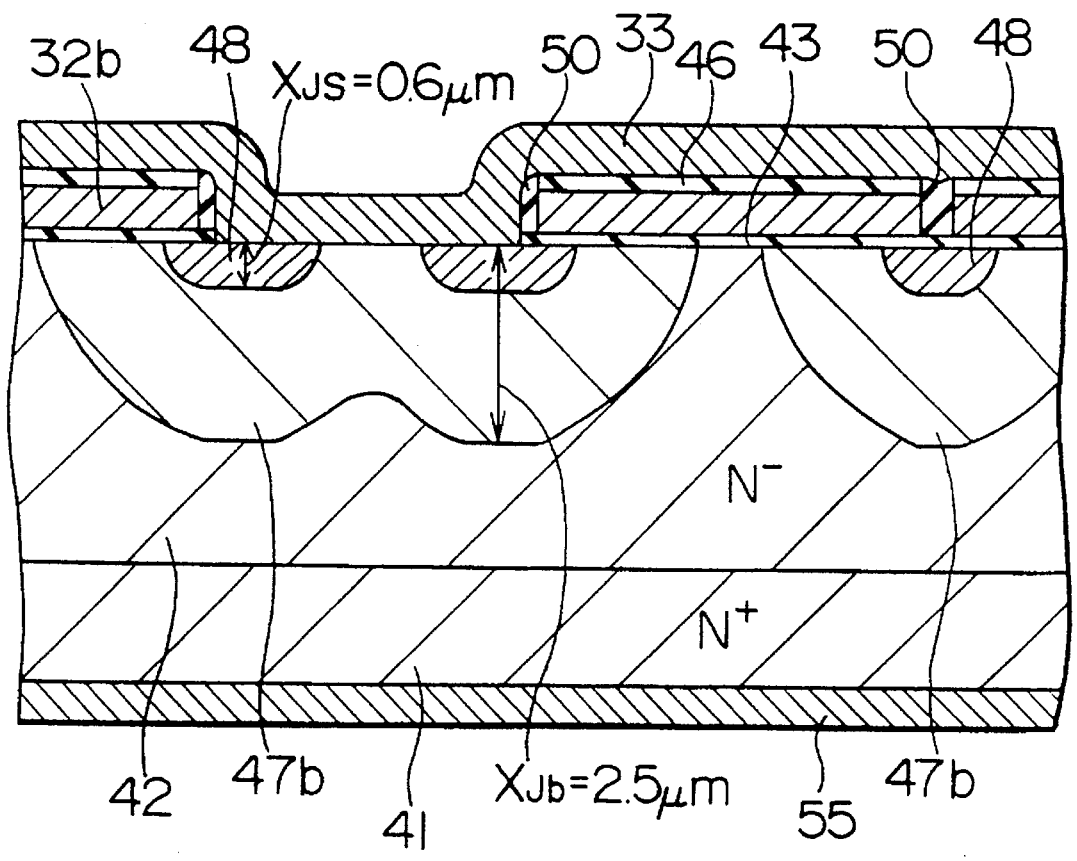
FIG. 16 shows a sectional view taken substantially along the lines 16—16 of FIG. 15.

Turning to FIGS. 15 to 16, the description will proceed to structure of a VDMOSFET included in the power semiconductor device illustrated in FIG. 14. FIG. 15 is an expanded schematic plan view which shows a rectangular region 15 enclosed with a dot-dash-line in FIG. 14 and which shows layers beneath the gate electrode 32b. FIG. 16 shows a sectional view taken substantially along the lines 16—16 of FIG. 15.

The illustrated VDMOSFET comprises the N$^+$-type silicon (Si) substrate 41. The N$^-$-type epitaxial layer 42 is formed on the upper surface of the N$^+$-type silicon (Si) substrate 41. The gate oxide film 43 and the gate electrode 32b are formed on the surface of the N$^-$-type epitaxial layer 42 in this order. The gate oxide film 43 has a thickness of about 50 nm. The gate electrode 32b consists of an N$^+$-type polysilicon film. As described above, the gate electrode 32b has the plurality of octagonal shaped opening windows 57 and 57a and the plurality of slit shaped opening windows 38 as shown in FIG. 14. The silicon oxide film 46 is formed on an upper surface of the gate electrode 32b. The silicon oxide film 46 acts as a first insulating film. The spacers 50 are formed on side surfaces of the gate electrode 32b or edge portions of both of the octagonal shaped opening windows 57 and 57a and the slit shaped opening windows 38. Each of the spacers 50 consists of a silicon oxide film which serves as a second insulating film. The spacers 50 are buried in the slit shaped opening windows 38 like in the first embodiment. This is because each of the slit shaped opening windows 38 has the slit width $L_S$ of 0.4 µm.

A plurality of P$^+$-type base regions 47b are formed beneath the surface of the N$^-$-type epitaxial layer 42 with each P$^+$-type base region 47b self-aligned to one of the slit shaped opening windows 38 and to two octagonal shaped opening windows 57 between which the slit shaped opening window in question connects. Each of the P$^+$-type base regions 47 has the vertical base junction depth $X_{jb}$ as shown in FIG. 16 and the horizontal base junction depth $X_{jb,1}$ beneath the gate electrode 32b as shown in FIG. 15. In the example being illustrated, the vertical base junction depth $X_{jb}$ is equal to 2.5 µm and the horizontal base junction depth $X_{jb,1}$ is substantially equal to about 2.0 µm. Two adjacent P$^+$-type base regions 47b are apart from one another by a space which is limited to the minimum interval $L_b$ of about 0.75 µm as shown in FIG. 15.

The plurality of N$^+$-type source regions 48 are formed beneath the surfaces of the P$^+$-type base regions 47b. Each of the N$^+$-type source regions 48 has the vertical source junction depth $X_{js}$ as shown in FIG. 16 and the horizontal source junction depth $X_{js,1}$ beneath the gate electrode 32b as shown in FIG. 15. In the example being illustrated, the vertical source junction depth $X_{js}$ is equal to 0.6 µm. The horizontal source junction depth $X_{js,1}$ is substantially equal to 0.5 µm.

As shown in FIG. 16, the silicon oxide film 46 and the spacers 50 are covered by the source electrode 33 which consists of an alloy film composed by composition of aluminum (Al), silicon (Si), and chlorine (Cl). The source electrode 33 is directly and electrically connected to both of the P⁺-type base regions 47b and the N⁺-type source regions 48 through the octagonal shaped opening windows 57 and 57a as contact holes. The drain electrode 55 is formed on the bottom surface of the N⁺-type silicon substrate 41. The drain electrode 55 consists of a metal film.

With this structure, each VDMOSFET has a normalized on-resistance ($A_C \cdot R_{ON}$) of about 0.127 mm²·Ω. The normalized on-resistance ($A_C \cdot R_{ON}$) in the third embodiment is smaller than that in the above-mentioned second embodiment. This is because in comparison with the second embodiment, the VDMOSFET of the third embodiment has a smaller cell size and a wider minimum interval $L_b$ between two adjacent P⁺-type base regions 47b. A virtual cell transistor in the third embodiment has an apparent channel width per 1 mm² of about 268 μm and an effective channel width per 1 mm² is substantially equal to 257 mm. A contributory rate, which indicates an increasing rate of the apparent channel versus the effective channel width, is about 86%. As compared with a conventional VDMOSFET comprising a gate electrode having an octagonal shaped opening window, a conventional VDMOSFET comprising a gate electrode having a square shaped opening window has a low normalized on-resistance ($A_C \cdot R_{ON}$). This is related to a channel width per a virtual cell transistor. In general, a power semiconductor comprising the gate electrode having the octagonal shaped opening window has a wider interval between two oblique adjacent cell transistors. As a result, the minimum interval $L_b$ in the third embodiment is wider than those in the first and the second embodiments as mentioned before.

The power semiconductor device according to the third embodiment has the polygonal shaped opening windows 57 and 57a each of which is octagonal in configuration. However, each polygonal shaped opening window may be (4 m)-sided polygonal in configuration such as dodecagonal (twelve-sided polygonal), hexadecagonal (sixteen-sided polygonal), and so on, where m represents an integer which is not less than two. That is, a polygon may have a center positioned on a lattice point of a two-dimensional square lattice which has a predetermined lattice interval in a first direction and in a second direction perpendicular to the first direction and the polygon may have a pair of sides parallel to the first direction and another pair of sides parallel to the second direction.

Figure 17:
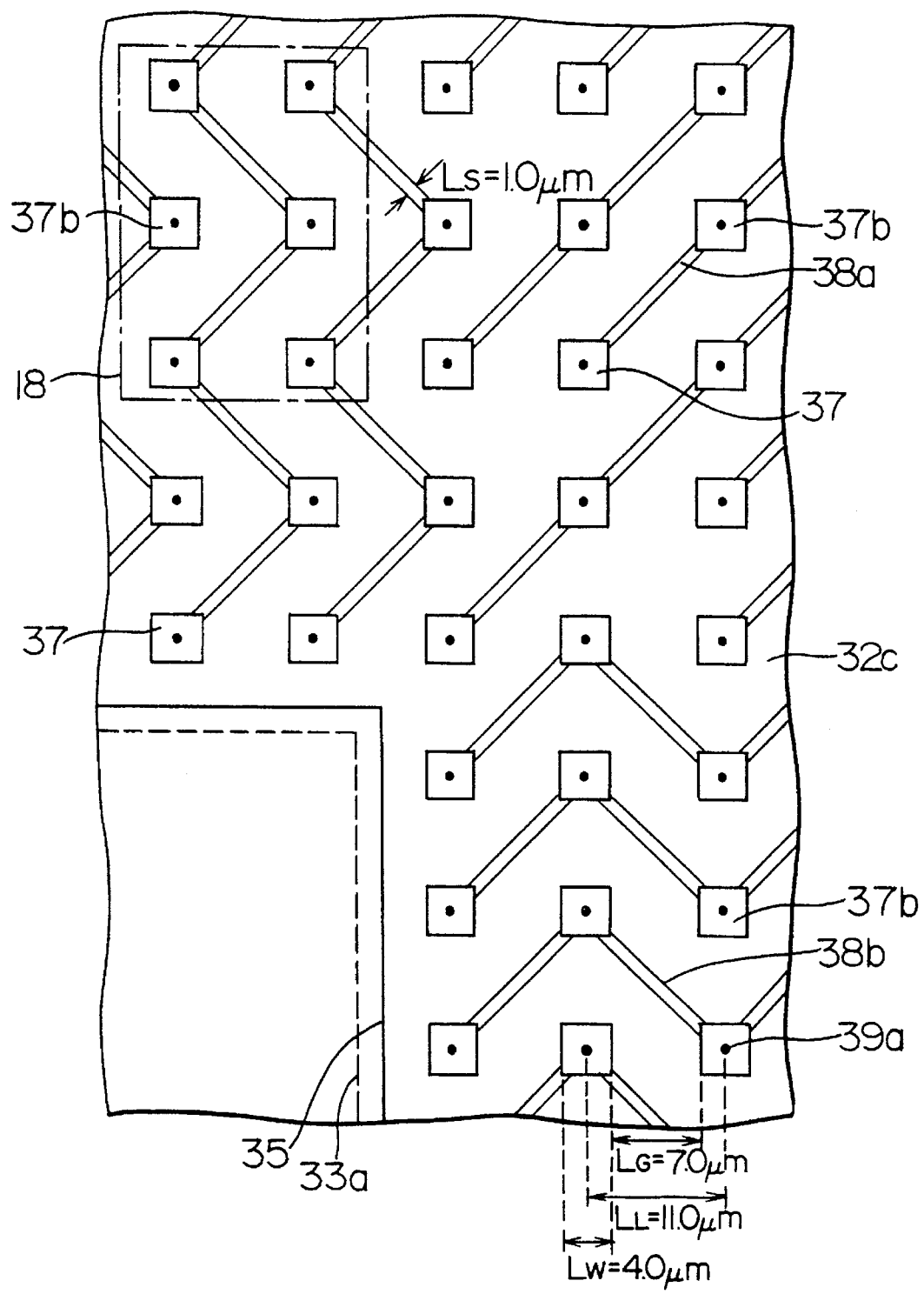
FIG. 17 is a schematic plane view showing a power semiconductor device according to a fourth embodiment of this invention and is an expanded schematic plane view showing a rectangular region 6 enclosed with the dot-dash-line in FIG. 5.

Referring to FIG. 17, the description will proceed to a power semiconductor device according to a fourth embodiment of this invention. FIG. 17 is an expanded schematic plan view showing the rectangular region 6 enclosed with the dot-dash-line in FIG. 5. The illustrated power semiconductor device is similar to that illustrated in FIG. 11 except that the gate electrode 32a is modified into a gate electrode 32c. The gate electrode 32c covers the greater part of an upper surface of a semiconductor chip like as 31 (FIG. 5). A source electrode (not shown) substantially covers a surface of the gate electrode 32c. The source electrode has the contact hole 33a. The gate electrode 32c is electrically connected through the contact hole 33a to the gate bonding pad 35 which is disposed in a part of a peripheral portion in the semiconductor chip. A part of the source electrode is electrically connected to a source bonding pad (not shown) which is disposed in another part of the peripheral portion in the semiconductor chip.

The gate electrode 32c has a plurality of square shaped opening windows such as opening windows 37 and 37b and the plurality of slit shaped opening windows 38a and 38b. In the example being illustrated, each of the square shaped opening windows 37 and 37b has four sides each of which has a side length $L_W$ of 4.0 μm. Each of the slit shaped opening windows 38a and 38b has a slit width $L_S$ of 1.0 μm. Each of the square shaped opening windows 37 and 37b has a center positioned on each of lattice points 39a in a two-dimensional square lattice which has a lattice constant $L_L$ of 11.0 μm. Two adjacent square shaped opening windows 37 and 37b are apart from each other by a space which is equal to the gate electrode length $L_G$ of 7.0 μm. A substantial difference between the fourth embodiment and the second embodiment is as follows. In the power semiconductor device according to the fourth embodiment, each of the square shaped opening windows 37a is connected to two slit shaped opening windows which are any pair of two slit shaped opening windows 38a, two slit shaped opening windows 38b, or one shaped opening window 38a and one slit shaped opening window 38b. Each of the square shaped opening windows 37 is connected to any one of one shaped opening window 38a and one slit shaped opening window 38b.

Figure 18:
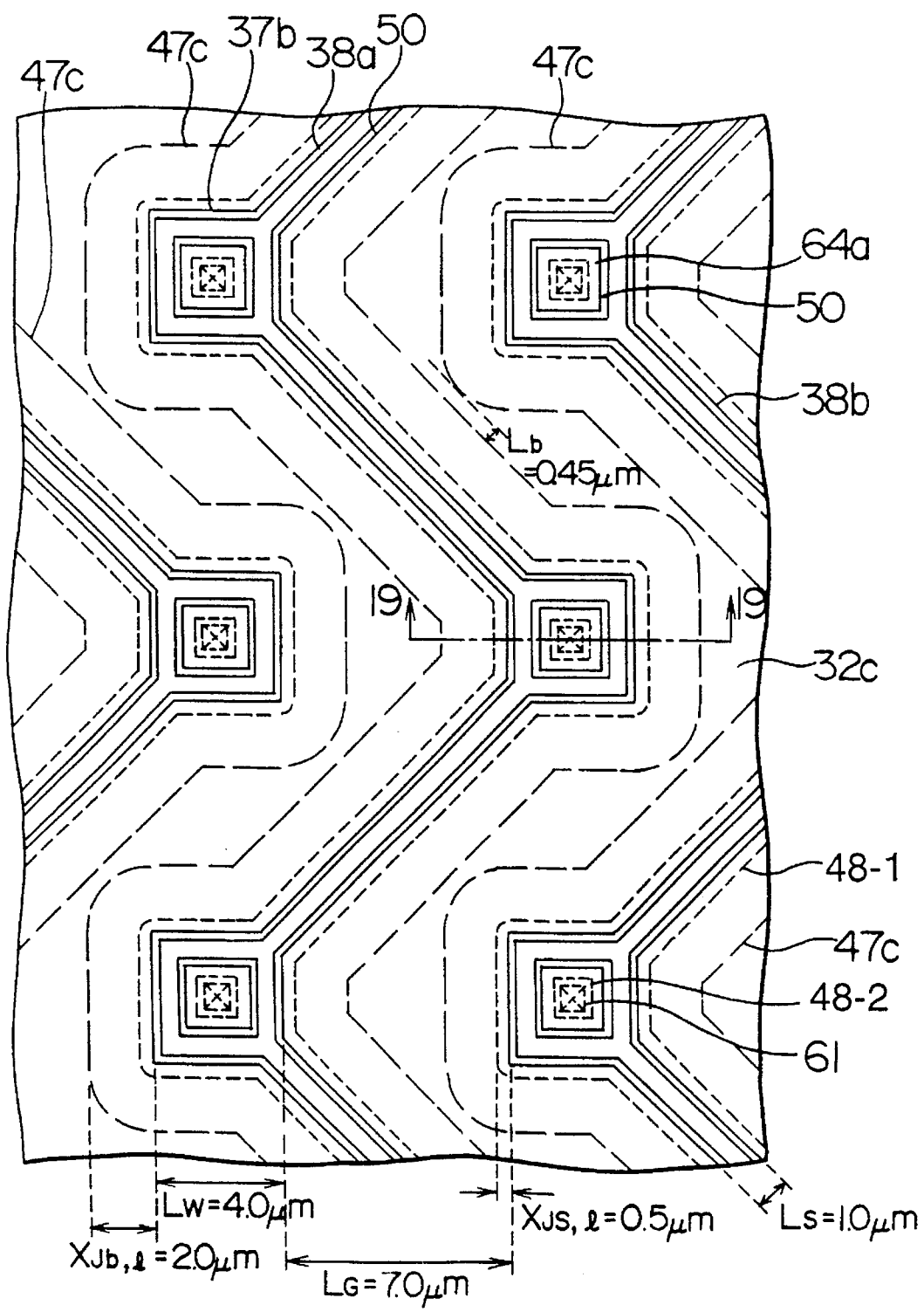
FIG. 18 is an expanded schematic plane view showing a rectangular region 18 enclosed with a dot-dash-line in FIG. 17.
Figure 19:
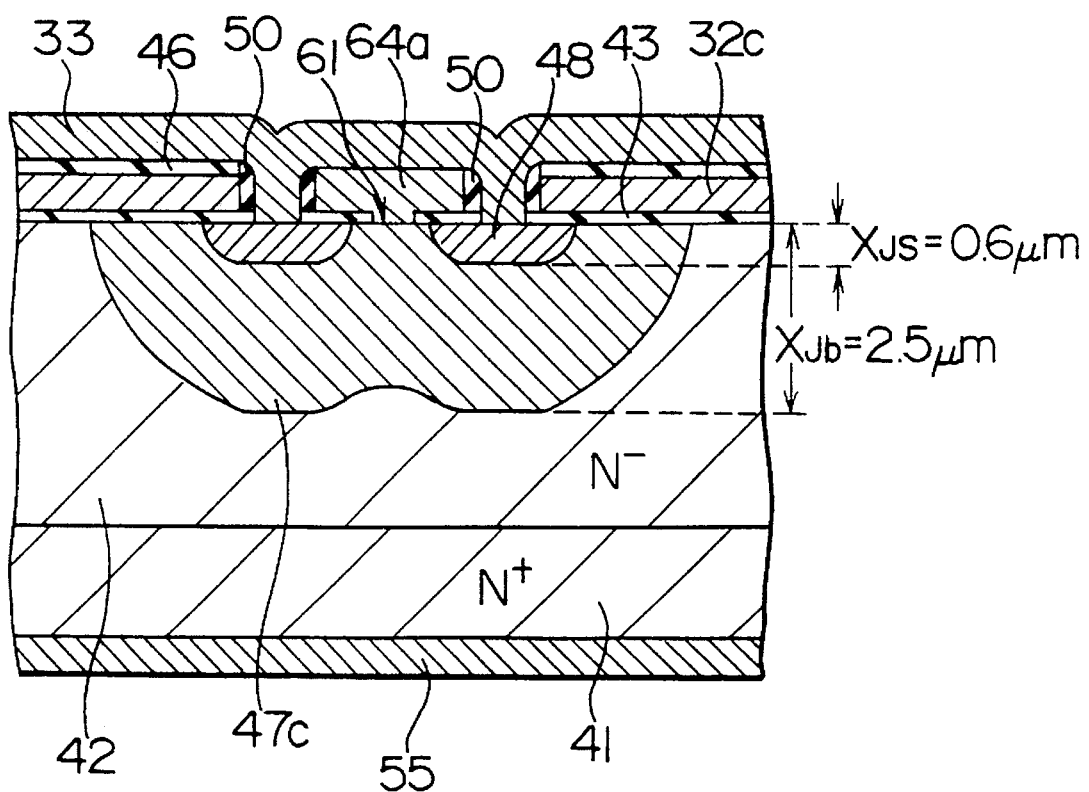
FIG. 19 shows a sectional view taken substantially along the lines 19—19 of FIG. 15.

Turning to FIGS. 18 to 19, the description will proceed to structure of a VDMOSFET included in the power semiconductor device illustrated in FIG. 17. FIG. 18 is an expanded schematic plan view which shows a rectangular region 18 enclosed with a dot-dash-line in FIG. 17 and which shows layers beneath the gate electrode 32c. FIG. 19 shows a sectional view taken substantially along the lines 19—19 of FIG. 18.

The illustrated VDMOSFET comprises the N⁺-type silicon (Si) substrate 41. The N⁻-type epitaxial layer 42 is formed on the upper surface of the N⁺-type silicon (Si) substrate 41. The gate oxide film 43 and the gate electrode 32c are formed on the surface of the N⁻-type epitaxial layer 42 in this order. The gate oxide film 43 has a thickness of about 50 nm. The gate electrode 32c consists of an N⁺-type polysilicon film which has a thickness of about 400 nm. As described above, the gate electrode 32c has the plurality of square shaped opening windows 37 and 37b and the plurality of slit shaped opening windows 38a and 38b as shown in FIG. 17. The silicon oxide film 46 is formed on an upper surface of the gate electrode 32c. The silicon oxide film 46 acts as a first insulation film. The spacers 50 are formed on side walls of the gate electrode 32c or edge portions of both of the square shaped opening windows 37 and 37b and the slit shaped opening windows 38a and 38b. Each of the spacers 50 consists of a silicon oxide film which serves as a second insulation film. The N⁺-type source regions 48 expose in the slit shaped opening windows 38a and 38b as the second embodiment. This is because each of the slit shaped opening windows 38a and 38b has the slit width $L_S$ of 1.0 μm.

A plurality of P⁺-type base regions 47c are formed beneath the surface of the N⁻-type epitaxial layer 42 with each P⁺-type base region 47c self-aligned to opening windows where the plurality of square shaped opening windows and the plurality of slit shaped opening windows are alternately connected to each other. Each of the P⁺-type base regions 47c has the vertical base junction depth $X_{jb}$ as shown in FIG. 19 and the horizontal base junction depth $X_{jb,1}$ beneath the gate electrode 32c as shown in FIG. 18. In the example being illustrated, the vertical base junction depth $X_{jb}$ is equal to 2.5 μm and the horizontal base junction depth $X_{jb,1}$ is substantially equal to about 2.0 μm. Two adjacent P⁺-type base regions 47c are apart from one another by a space which is limited to the minimum interval $L_b$ of about 0.45 μm like the second embodiment and as shown in FIG. 18.

The plurality of N⁺-type source regions 48 are formed beneath the surfaces of the P⁺-type base regions 47c. Each of the N⁺-type source regions 48 has the vertical source junction depth $X_{js}$ as shown in FIG. 19 and the horizontal source junction depth $X_{js,1}$ beneath the gate electrode 32c as shown in FIG. 18. In the example being illustrated, the vertical source junction depth $X_{js}$ is equal to 0.6 µm. The horizontal source junction depth $X_{js,1}$ is substantially equal to 0.5 µm.

A second characteristic of the fourth embodiment substantially different from the second embodiment is that base leading electrodes 64a are formed on central portions in the square shaped opening windows 37 and 37b. Each of the base leading electrodes 64a consists of a P⁺-type polysilicon film having a thickness of about 475 nm. Each of base leading electrodes 64a has side walls on which the spacer 50 is formed. Each of base leading electrodes 64a is directly and electrically connected to the P⁺-type base region 47 through a direct contact hole 61 which is made in the gate oxide film 43.

As shown in FIG. 19, the silicon oxide film 46 and the spacers 50 are covered by the source electrode 33 which consists of an alloy film composed by composition of aluminum (Al), silicon (Si), and chlorine (Cl). The source electrode 33 is directly and electrically connected to the base leading electrodes 64a. The source electrode 33 is directly and electrically connected to the N⁺-type source regions 48 through the square shaped opening windows 37 and 37b and the slit shaped opening windows 38a and 38b as contact holes. The drain electrode 55 is formed on the bottom surface of the N⁺-type silicon substrate 41. The drain electrode 49 consists of a metal film.

With this structure, each VDMOSFET has a normalized on-resistance ($A_C \cdot R_{ON}$) of about 0.109 mm²·Ω. The normalized on-resistance ($A_C \cdot R_{ON}$) in the fourth embodiment is smaller than that in the above-mentioned third embodiment. The power semiconductor device according to the fourth embodiment has a peculiar merit which is capable of decreasing a contact resistance of the source electrode 33 versus the base regions 47c. This is because, by providing with the base leading electrodes 64a, the power semiconductor device according to the fourth embodiment has a larger contact area between the base regions 47c and both of the base leading electrodes 64a and the base electrode 32c compared with that between the base regions and the base electrode in the other embodiment. It is therefore possible for the fourth embodiment to easily suppress a floating state in the P⁺-type base regions 47c due to the contact resistance, thereby decreasing a parasitic NPN transistor effect. The power semiconductor device according to the fourth embodiment is particularly effective in suppression for increasing of the contact resistance accompanied by miniaturization of elements. In addition, the base leading electrodes 64a for use in the power semiconductor device according to the fourth embodiment may apply to the power semiconductor devices according to the first, the second, and the third embodiments.

Referring to FIGS. 20A to 20D, the description will be made as regards a method of fabricating the power semiconductor device illustrated in FIGS. 17 to 19. Each of FIGS. 20A to 20D shows a sectional view taken substantially along the lines 19—19 of FIG. 18. In the similar manner illustrated in FIGS. 10A to 10D, the illustrated fabricating method is 0.4 µm process with the minimum processing size of 0.4 µm and with alignment accuracy of ±0.05 µm.

Figure 20A:
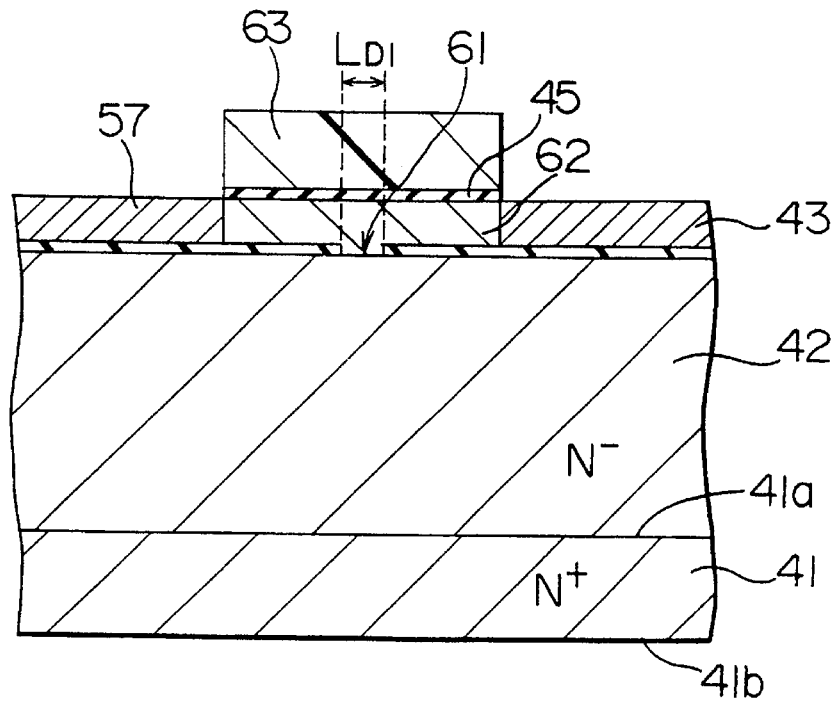
FIGS. 20A to 20D illustrate the fabricating process sequence of the power semiconductor device illustrated in FIGS. 17 to 19.

As shown in FIG. 20A, the N⁺-type silicon substrate 41 is prepared in a known manner and has the upper surface 41a and the bottom surface 41b which are directed upwards and downwards of FIG. 20A. The N⁻-type epitaxial layer 42 is formed on the upper surface 41a of the N⁺-type silicon substrate 41. The gate oxide film 43 is formed on the surface of the N⁻-type epitaxial layer 42 by thermal oxidation. The gate oxide film 43 has direct contact holes such as the direct contact hole 61 positioned on parts where each of the square shaped opening windows 37 and 37a should have a center. The direct contact hole 61 is square in shape having four sides each of which has a side length $L_{D1}$ of, for example, 0.6 µm. A non-doped polysilicon film 62 is formed on the gate oxide film 43 by the CVD process. The non-doped polysilicon film 62 has a thickness of about 650 nm. The silicon nitride film 45 having a predetermined thickness is formed on a surface of the non-doped polysilicon film 62 by the CVD process. By etching using a photo resist film 63 as a mask, the silicon nitride film 45 is removed in an area except for partial areas where the square shaped opening windows 37 and 37a and the slit opening windows 38a and 38b should be formed. By ion implantation of arsenic (As) using the photo resist film 63 as the mask, the non-doped polysilicon film 62 from which the silicon nitride film 45 is removed is converted into the N⁺-type polysilicon film 57 as shown in FIG. 20A.

Figure 20B:
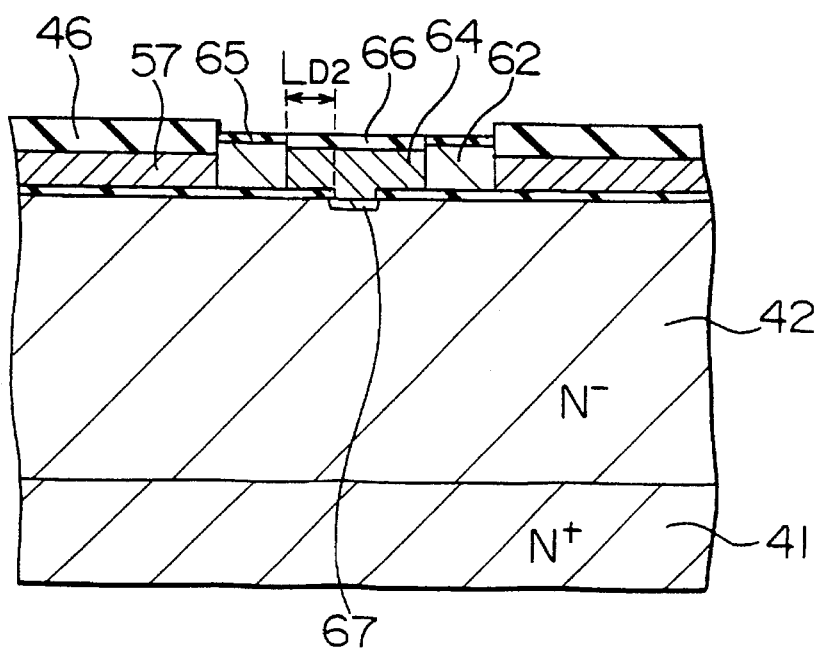

Referring to FIG. 20B in addition to FIG. 20A, after removal of the photoresist film 63, by etching using another photoresist film (not shown) as a mask, the silicon nitride film 45 is once more removed in partial areas where the base leading electrodes 64a (FIG. 19) should be formed. Each of the remaining silicon nitride films 45 is apart from each of the direct contact holes 61 by an interval $L_{D2}$. The interval $L_{D2}$ is less than the horizontal source junction depth $X_{js,1}$ and is equal, for example, to 0.7 µm. This is because it is preferable that the N⁺-type source regions 48 do not exist beneath the direct contact holes 61. By ion implantation of boron (B) using the photoresist film as a mask, P⁺-type polysilicon films 64 are formed. The ion implantation of boron is carried out under the condition of acceleration energy of 100 keV and of ion density of 2×10¹⁵ cm⁻². After removal of the photoresist film, thermal oxidation is made by steam as, for example, 950° C., thereby the silicon oxide film 46 and the silicon oxide films 66 are formed on a surface of the N⁺-type polysilicon film 57 and surfaces of the P⁺-type polysilicon films 64, respectively. The silicon oxide film 46 has a thickness of about 500 nm while each of the silicon oxide films 66 has a thickness of 250 nm. By this thermal oxidation, P⁺-type diffusion regions 67 are formed on the surface of the N⁻-type epitaxial layer 42 with the P⁺-type diffusion regions 67 self-aligned to the direct contact holes 61. Each of the P⁺-type diffusion regions 67 has a junction depth which is sufficiently shallower than the vertical base junction depth $X_{jb}$ of the P⁺-type base region 47c (FIG. 19). In addition, by this thermal oxidation, the N⁺-type polysilicon film 57 and the P⁺-type polysilicon films 64 have the thickness of about 400 nm and of about 475 nm, respectively.

Figure 20C:
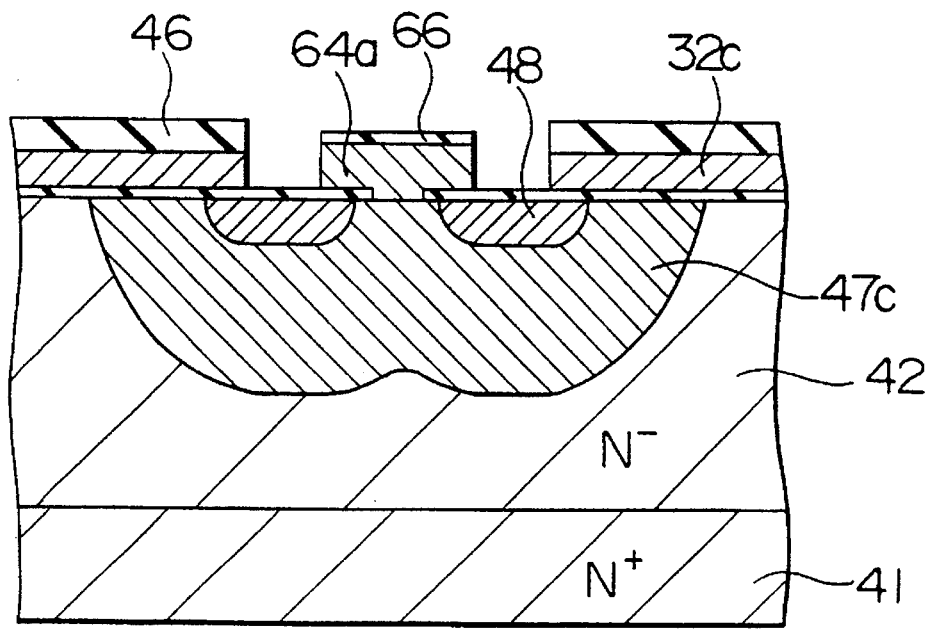

Referring to FIG. 20C in addition to FIG. 20B, the remaining silicon nitride films 45 are removed by wet etching. The non-doped polysilicon films 62 are selectively removed by anisotropic etching using the silicon oxide films 46 and 66 as masks. The anisotropic etching is carried out using HBr and so on. In this step, the N⁺-type polysilicon film 57 and the P⁺-type polysilicon film 64 serve as the gate electrode 32c and the base leading electrodes 64a, respectively. The gate oxide film 43 is removed from the N⁻-type epitaxial layer 42 in exposed portions by the wet etching in the similar manner illustrated in FIG. 10B although drawing is omitted. By thermal oxidation, a silicon oxide film (not shown) is formed on an exposed surface of the N⁻-type epitaxial layer 42, of the gate electrode 32c, and of the base leading electrodes 64a. The silicon oxide film has a thickness of about 10 nm. In this step, the silicon oxide films 46 and 66 have the thickness of 400 nm and 150 nm, respectively. Subsequently, in the similar manner as the first embodiment, the P⁺-type base regions 47c are formed beneath a surface of the N⁻-type epitaxial layer 42 and thereafter the N⁺-type source regions 48 are formed beneath a surface of the P⁺-type base regions 47c, respectively. In addition, the P⁺-type diffusion regions 67 (FIG. 20B) are assimilated into the P⁺-type base regions 47c, respectively (FIG. 20C).

Figure 20D:
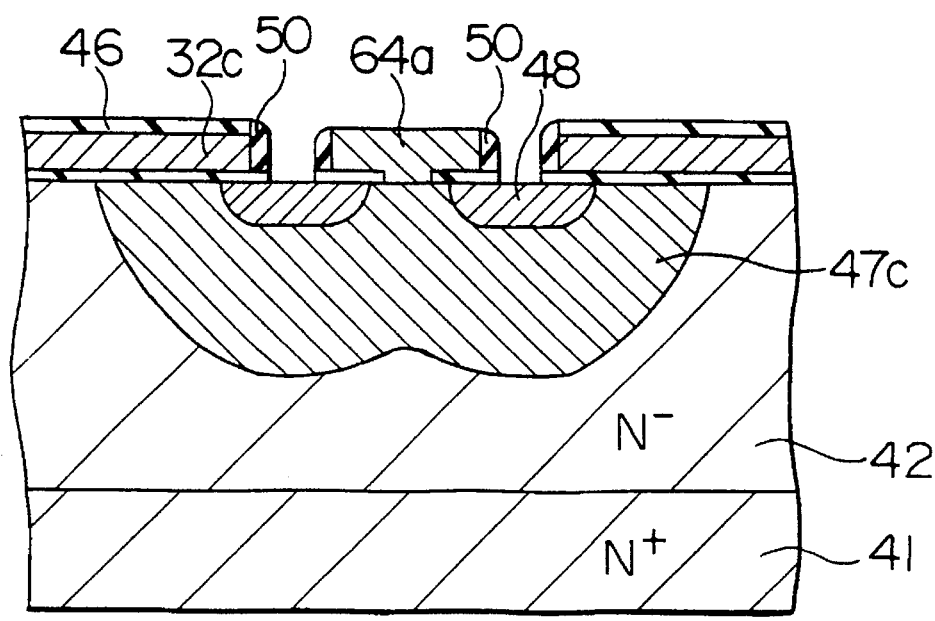

Referring to FIG. 20D in addition to FIG. 20C, the silicon oxide films 66 are removed. This removal may be carried out using a photoresist film (not shown). When the photoresist film is not used, an entire etching may be carried out, for example, a wet etching. Under the circumstances, the silicon oxide film 46 has the thickness of about 200 nm. In addition, in this event, a silicon oxide film (not shown) having a thickness of about 25 nm by thermal oxidation is once more formed on an exposed surface of the N⁻-type epitaxial layer 42, of the gate electrode 32c, and of the base leading electrodes 66 in order to repair side etching of the gate oxide film 43 beneath both of the gate electrode 32c and the base leading electrodes 66. By the CVD process, a silicon oxide film (not shown) is deposited on an entire surface. The silicon oxide film has a thickness of about 200 nm. By etching back the silicon oxide film, the spacers 50 are formed on side walls of both of the gate electrode 32c and the base leading electrodes 66 as shown in FIG. 20D. Thereafter, the source electrode 33 and the drain electrode 55 are formed as shown in FIG. 19, thereby the power semiconductor device is fabricated as illustrated in FIGS. 17 to 19.

When a VDMOSFET comprises a gate electrode which has a plurality of polygonal (for example, square) opening windows alone, a base vertical junction depth ($X_{jb}$) in base regions of opposite conduction type is determined on the basis of a thickness of an epitaxial layer of one conduction type, of impurity concentration, and of a required breakdown voltage. In a case of the VDMOSFET with a low breakdown voltage, a base horizontal junction depth ($X_{jb,1}$) beneath the gate electrode is determined by the base vertical junction depth ($X_{jb}$). When the VDMOSFET has a fixed channel length and a fixed source vertical junction depth ($X_{js}$), a gate electrode length ($L_G$) and a side length ($L_W$) in each polygonal opening window are defined so as to minimize on-resistance per unit area (normalized on-resistance ($A_C \cdot R_{ON}$) or to maximize a channel width per unit area. When the gate electrode length ($L_G$) is determined, the optimum value ($L_G - 2X_{jb,1}$) is defined which indicates a distance between two adjacent VDMOSFETs in a first direction or a second direction. In this event, a distance between base regions of two oblique adjacent VDMOSFETs widens by an amount of $(2^{0.5}-1)L_G$ between the polygonal opening windows of the two oblique adjacent VDMOSFETs.

The semiconductor device according to this invention comprises a gate electrode having not only a plurality of polygonal shaped opening windows but also a plurality of slit shaped opening windows each of which has a predetermined slit width and which is disposed between two oblique adjacent polygonal shaped opening windows where a distance between base regions widens. An additional channel region is therefore formed on both sides of each slit shaped opening window, a total channel region has effectively an enlarged width, thereby resulting in decreasing the normalized on-resistance ($A_C \cdot R_{ON}$). As a result, the semiconductor device according to this invention has a reduced normalized on-resistance ($A_C \cdot R_{ON}$) in comparison with a conventional power semiconductor device comprising a gate electrode having, for instance, a plurality of closely packed regular hexagonal shaped opening windows as disclosed in the above-mentioned U.S. Pat. No. 5,008,725.

While this invention has thus far been described in conjunction with a few embodiments thereof, it will now be readily possible for those skilled in the art to put this invention into practice in various other manners. For example, the present invention can be applied to p-channel VDMOSFETs although each of the aforementioned embodiments has been described as the n-channel VDMOSFET.

What is claimed is:

1. A vertical double-diffused metal oxide semiconductor field effect transistor (MOSFET) comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a plurality of polygonal shaped opening windows each of which has a center positioned on each of lattice points of a two-dimensional square lattice comprising a plurality of unit cells, each of the unit cells being defined by two pairs of opposed sides, one pair of the opposed sides extending along a first direction and being apart from one another at a predetermined distance, another pair of the opposed sides extending along a second direction orthogonal to the first direction and being apart from one another at the predetermined distance, said gate electrode having at least one slit shaped opening window which is laid on a straight line connecting two centers of two polygonal shaped opening windows which are obliquely adjacent to one another;

a first insulating layer formed on an upper surface of said gate electrode;

second insulating layers formed on side walls of said gate electrode;

a base region of a second conductivity type which is opposite to the first conductivity type, said base region having a predetermined base junction depth, said base region being formed in the surface of said epitaxial layer, said base region being self-aligned to the polygonal shaped opening windows and the slit shaped opening window;

a source region of the first conductivity type having a source junction depth shallower than the base junction depth, said source region having an outer edge self-aligned to both of the polygonal shaped opening windows and the slit shaped opening window and an inner edge spaced apart from edges of the polygonal shaped opening windows at a predetermined width;

a source electrode covering said first and said second insulating layers, said source electrode being directly connected to said source region with said source electrode short-circuited to said base region in at least the polygonal shaped opening windows; and a drain electrode formed on the bottom surface of said semiconductor substrate.

2. A vertical double-diffused MOSFET as claimed in claim 1, wherein said semiconductor substrate is a silicon substrate.

3. A vertical double-diffused MOSFET as claimed in claim 1, wherein said gate insulating layer is a gate oxide layer.

4. A vertical double-diffused MOSFET as claimed in claim 1, wherein each of the polygonal shaped opening windows comprises a pair of opposed sides in parallel with the first direction and another pair of opposed sides in parallel with the second direction.

5. A vertical double-diffused MOSFET as claimed in claim 4, wherein each of said polygonal shaped opening windows is square in configuration.

6. A vertical double-diffused MOSFET as claimed in claim 4, wherein each of said polygonal shaped opening windows is octagonal in configuration.

7. A vertical double-diffused MOSFET as claimed in claim 1, said gate electrode having a plurality of slit shaped opening windows, wherein one of the polygonal shaped opening windows is connected through two slit shaped opening windows to two of the polygonal shaped opening windows that are obliquely adjacent to the one of the polygonal shaped opening windows.

8. A vertical double-diffused MOSFET as claimed in claim 1, wherein said source electrode is directly connected to said source region in the slit shaped opening window.

9. A vertical double-diffused MOSFET as claimed in claim 1, further comprising a plurality of base leading electrodes of the second conductivity type which are directly connected to said base region in central portions of the respective polygonal shaped opening windows through direct contact holes, said source electrode being connected to said base regions through said base leading electrodes, each of said base leading electrodes having a side wall on which said second insulating layer is formed.

10. A vertical double-diffused MOSFET as claimed in claim 9, wherein each of said leading electrodes consists of a polysilicon layer.

11. A vertical double-diffused metal oxide semiconductor field effect transistor (MOSFET) comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a pair of square shaped opening windows which are obliquely adjacent to one another and a slit shaped opening window connecting the pair of square shaped opening windows;

a first insulating layer formed on an upper surface of said gate electrode;

second insulating layers formed on side walls of said gate electrode;

a base region of a second conductivity type which is opposite to the first conductivity type, said base region being formed in the surface of said epitaxial layer, said base region being self-aligned to the pair of square shaped opening windows and the slit shaped opening window;

a source region of the first conductivity type having a source junction depth shallower than the base junction depth, said source region having an outer edge self-aligned to both of the square shaped opening windows and the slit shaped opening window and an inner edge spaced apart from edges of the square shaped opening windows at a predetermined width;

a source electrode covering said first and said second insulating layers, said source electrode being directly connected to said source region with said source electrode short-circuited to said base region in the pair of square shaped opening windows; and a drain electrode formed on the bottom surface of said semiconductor substrate.

12. A vertical double-diffused MOSFET as claimed in claim 11, wherein said semiconductor substrate is a silicon substrate.

13. A vertical double-diffused MOSFET as claimed in claim 11, wherein said gate insulating layer is a gate oxide layer.

14. A vertical double-diffused metal oxide semiconductor field effect transistor (MOSFET) comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a pair of square shaped opening windows which are obliquely adjacent to one another and a slit shaped opening window connecting the pair or square shaped opening windows;

a first insulating layer formed on an upper surface of said gate electrode;

second insulating layers formed on side walls of said gate electrode;

a base region of a second conductivity type which is opposite to the first conductivity type, said base region having a base junction depth, said base region being formed in the surface of said epitaxial layer, said base region being self-aligned to the pair of square shaped opening windows and the slit shaped opening window;

a source region of the first conductivity type having a source junction depth shallower than the base junction depth, said source region having an outer edge self-aligned to both of the square shaped opening windows and the slit shaped opening window and an inner edge spaced apart from edges of the square shaped opening windows at a predetermined width;

a source electrode covering said first and said second insulating layers, said source electrode being directly connected to said source region with said source electrode short-circuited to said base region in the pair of square shaped opening windows, said source electrode being directly connected to said source region in the slit shaped opening window; and a drain electrode formed on the bottom surface of said semiconductor substrate.

15. A vertical double-diffused MOSFET as claimed in claim 14, wherein said semiconductor substrate is a silicon substrate.

16. A vertical double-diffused MOSFET as claimed in claim 14, wherein said gate insulating layer is a gate oxide layer.

17. A vertical double-diffused metal oxide semiconductor field effect transistor (MOSFET) comprising:

a semiconductor substrate of a first conductivity type having a main surface and a bottom surface opposite to the main surface, said semiconductor substrate being doped with impurities of the first conduction type that has substrate impurity concentration;

an epitaxial layer of the first conductivity type formed on the main surface of said semiconductor substrate, said epitaxial layer being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a pair of octagonal shaped opening windows which are obliquely adjacent to one another and a slit shaped opening window connecting the pair of octagonal shaped opening windows;

a first insulating layer formed on an upper surface of said gate electrode;

second insulating layers formed on side walls of said gate electrode;

a base region of a second conductivity type which is opposite to the first conductivity type, said base region having a base junction depth, said base region being formed in the surface of said epitaxial layer, said base region being self-aligned to the pair of octagonal shaped opening windows and the slit shaped opening window;

a source region of the first conductivity type having a source junction depth shallower than the base junction depth, said source region having an outer edge self-aligned to both of the octagonal shaped opening windows and the slit shaped opening window and an inner edge spaced apart from edges of the octagonal shaped opening windows at a predetermined width;

a source electrode covering said first and said second insulating layers, said source electrode being directly connected to said source region with said source electrode short-circuited to said base region in the pair of octagonal shaped opening windows; and a drain electrode formed on the bottom surface of said semiconductor substrate.

18. A vertical double-diffused MOSFET as claimed in claim 17, wherein said semiconductor substrate is a silicon substrate.

19. A vertical double-diffused MOSFET as claimed in claim 17, wherein said gate insulating layer is a gate oxide layer.

20. A vertical double-diffused metal oxide semiconductor field effect transistor (MOSFET) comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a plurality of square shaped opening windows each of which has a center positioned on each of lattice points of a two-dimensional square lattice comprising a plurality of unit cells, each of the unit cells being defined by two pairs of opposed sides, one pair of the opposed sides extending along a first direction and being apart from one another at a predetermined distance, another pair of the opposed sides extending along a second direction orthogonal to the first direction and being apart from one another at the predetermined distance, said gate electrode having a plurality of slit shaped opening windows connecting two centers of two of said square shaped opening windows that are obliquely adjacent to one another;

a plurality of base leading electrodes of a second conductivity type which is opposite to the first conductivity type, said base leading electrodes being disposed in central portions of the respective square shaped opening windows;

a first insulating layer formed on an upper surface of said gate electrode;

second insulating layers formed on side walls of both of said gate electrode and said base leading electrodes;

a base region of a second conductivity type having a base junction depth, said base region being formed in the surface of said epitaxial layer, said base region being self-aligned to the square shaped opening windows and the slit shaped opening window, said base region being directly connected to said base leading electrodes through respective direct contact holes;

a source region of the first conductivity type having a source junction depth shallower than the base junction depth, said source region having an outer edge self-aligned to both of the square shaped opening windows and the slit shaped opening window and an inner edge spaced apart from edges of the square shaped opening windows at a predetermined width;

a source electrode covering said first and said second insulating layers and said base leading electrodes, said source electrode being directly connected to said source region with said source electrode short-circuited to said base region through said base leading electrodes, said source electrode being directly connected to said source region in the slit shaped opening window; and a drain electrode formed on the bottom surface of said semiconductor substrate.

21. A vertical double-diffused MOSFET as claimed in claim 20, wherein said semiconductor substrate is a silicon substrate.

22. A vertical double-diffused MOSFET as claimed in claim 20, wherein said gate insulating layer is a gate oxide layer.

23. A vertical double-diffused MOSFET as claimed in claim 20, wherein each of said base leading electrodes consists of a polysilicon layer.

24. A power semiconductor device having a plurality of vertical double-diffused metal oxide semiconductor field effect transistors (MOSFETs) which are connected to each other in parallel, said power semiconductor device comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer having a predetermined thickness and being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a plurality of polygonal shaped opening windows each of which has a center positioned on each of lattice points of a two-dimensional square lattice comprising a plurality of unit cells, each of the unit cells being defined by two pairs of opposed sides, one pair of the opposed sides extending along a first direction and being apart from one another at a predetermined distance, another pair of the opposed sides extending along a second direction orthogonal to the first direction and being apart from one another at the predetermined distance, said gate electrode having a plurality of slit shaped opening windows each of which is laid on a straight line connecting two centers of two polygonal shaped opening windows which are obliquely adjacent to one another;

a first insulating layer formed on an upper surface of said gate electrode;

second insulating layers formed on side walls of said gate electrode;

a plurality of base regions of a second conductivity type which is opposite to the first conductivity type, each of said base regions having a base junction depth, said base regions being formed in the surface of said epitaxial layer, each of said base regions being self-aligned to the polygonal shaped opening windows and the slit shaped opening windows;

a plurality of source regions of the first conductivity type having a source junction depth shallower than the base junction depth, said source region having an outer edge self-aligned to both of the polygonal shaped opening windows and the slit shaped opening windows and an inner edge spaced apart from edges of the polygonal shaped opening windows at a predetermined width;

a source electrode covering said first and said second insulating layers, said source electrode being directly connected to said source regions with said source electrode short-circuited to said base regions in at least the polygonal shaped opening windows; and a drain electrode formed on the bottom surface of said semiconductor substrate.

25. A power semiconductor device as claimed in claim 24, wherein said semiconductor substrate is a silicon substrate.

26. A power semiconductor device as claimed in claim 24, wherein said gate insulating layer is a gate oxide layer.

27. A power semiconductor device as claimed in claim 24, wherein each of the polygonal shaped opening windows comprises a pair of opposed sides in parallel with the first direction and another pair of opposed sides in parallel with the second direction.

28. A power semiconductor device as claimed in claim 27, wherein each of said polygonal shaped opening windows is square in configuration.

29. A power semiconductor device as claimed in claim 27, wherein each of said polygonal shaped opening windows is octagonal in configuration.

30. A power semiconductor device as claimed in claim 24, wherein one of the polygonal shaped opening windows is connected through two slit shaped opening windows to two of the polygonal shaped opening windows that are obliquely adjacent to the one of the polygonal shaped opening windows.

31. A power semiconductor device as claimed in claim 24, wherein said source electrode is directly connected to said source regions in the slit shaped opening windows.

32. A power semiconductor device as claimed in claim 24, further comprising a plurality of base leading electrodes of the second conductivity type which are directly connected to said base regions in central portions of the respective polygonal shaped opening windows through direct contact holes, each of said base leading electrodes having a side wall on which said second insulating layer is formed, whereby said source electrode is connected to said base regions through said base leading electrodes.

33. A power semiconductor device as claimed in claim 32, wherein each of said base leading electrodes consists of a polysilicon layer.

34. A power semiconductor device having a plurality of vertical double-diffused metal oxide semiconductor field effect transistors (MOSFETs) which are connected to each other in parallel, said power semiconductor device comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer having a predetermined thickness and being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a plurality of square shaped opening windows each of which has a center positioned on each of lattice points of a two-dimensional square lattice comprising a plurality of unit cells, each of the unit cells being defined by two pairs of opposed sides, one pair of the opposed sides extending along a first direction and being apart from one another at a predetermined distance, another pair of the opposed sides extending along a second direction orthogonal to the first direction and being apart from one another at the predetermined distance, said gate electrode having a plurality of slit shaped opening windows each of which is laid on a straight line connecting two centers of two of the square shaped opening windows that are obliquely adjacent to one another;

a first insulating layer formed on an upper surface of said gate electrode;

a plurality of second insulating layers formed on side walls of said gate electrode;

a plurality of base regions of a second conductivity type which is opposite to the first conductivity type, each of said base regions having a base junction depth, said base regions being formed in the surface of said epitaxial layer, each of said base regions being self-aligned to two of the square shaped opening windows and one of the slit shaped opening windows;

a plurality of source regions of the first conductivity type having a source junction depth shallower than the base junction depth, each of said source regions having an outer edge self-aligned to the two of the square shaped opening windows and the one of the slit shaped opening windows and an inner edge spaced apart from edges of the two of the square shaped opening windows at a predetermined width;

a source electrode covering said first and said second insulating layers, said source electrode being directly connected to said source regions with said source electrode short-circuited to said base regions in the square shaped opening windows; and a drain electrode formed on the bottom surface of said semiconductor substrate.

35. A power semiconductor device as claimed in claim 34, wherein said semiconductor substrate is a silicon substrate.

36. A power semiconductor device as claimed in claim 34, wherein said gate insulating layer is a gate oxide layer.

37. A power semiconductor device having a plurality of vertical double-diffused metal oxide semiconductor field effect transistors (MOSFETs) which are connected to each other in parallel, said power semiconductor device comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer having a predetermined thickness and being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a plurality of square shaped opening windows each of which has a center positioned on each of lattice points of a two-dimensional square lattice comprising a plurality of unit cells, each of the unit cells being defined by two pairs of opposed sides, one pair of the opposed sides extending along a first direction and being apart from one another at a predetermined distance, another pair of the opposed sides extending along a second direction orthogonal to the first direction and being apart from one another at the predetermined distance, said gate electrode having a plurality of slit shaped opening windows each of which is laid on a straight line connecting two centers of two of the square shaped opening windows which are obliquely adjacent to one another;

a first insulating layer formed on an upper surface of said gate electrode;

a plurality of second insulating layers formed on side walls of said gate electrode;

a plurality of base regions of a second conductivity type which is opposite to the first conductivity type, each of said base regions having a base junction depth, said base regions being formed in the surface of said epitaxial layer, each of said base regions being self-aligned to two of the square shaped opening windows and one of the slit shaped opening windows;

a plurality of source regions of the first conductivity type having a source junction depth shallower than the base junction depth, each of said source regions having an outer edge self-aligned to the two of the square shaped opening windows and the one of the slit shaped opening windows and an inner edge spaced apart from edges of the two of the square shaped opening windows at a predetermined width;

a source electrode covering said first and said second insulating layers, said source electrode being directly connected to said source regions with said source electrode short-circuited to said base regions in the square shaped opening windows; said electrode being directly connected to said source regions in the slit shaped opening window; and a drain electrode formed on the bottom surface of said semiconductor substrate.

38. A power semiconductor device as claimed in claim 37, wherein said semiconductor substrate is a silicon substrate.

39. A power semiconductor device as claimed in claim 37, wherein said gate insulating layer is a gate oxide layer.

40. A power semiconductor device having a plurality of vertical double-diffused metal oxide semiconductor field effect transistors (MOSFETs) which are connected to each other in parallel, said power semiconductor device comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer having a predetermined thickness and being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a plurality of octagonal shaped opening windows each of which has a center positioned on each of lattice points of a two-dimensional square lattice comprising a plurality of unit cells, each of the unit cells being defined by two pairs of opposed sides, one pair of the opposed sides extending along a first direction and being apart from one another at a predetermined distance, another pair of the opposed sides extending along a second direction orthogonal to the first direction and being apart from one another at the predetermined distance, said gate electrode having a plurality of slit shaped opening windows each of which is laid on a straight line connecting two centers of two of the octagonal shaped opening windows that are obliquely adjacent to one another;

a first insulating layer formed on an upper surface of said gate electrode;

a plurality of second insulating layers formed on side walls of said gate electrode;

a plurality of base regions of a second conductivity type which is opposite to the first conductivity type, each of said base regions having a base junction depth, said base regions being formed in the surface of said epitaxial layer, each of said base regions being self-aligned to two of the octagonal shaped opening windows and one of the slit shaped opening windows;

a plurality of source regions of the first conductivity type having a source junction depth shallower than the base junction depth, each of said source regions having an outer edge self-aligned to the two of the octagonal shaped opening windows and the one of the slit shaped opening windows and an inner edge spaced apart from edges of the two of the octagonal shaped opening windows at a predetermined width;

a source electrode covering said first and said second insulating layers, said source electrode being directly connected to said source regions with said source electrode short-circuited to said base regions in the octagonal shaped opening windows; and a drain electrode formed on the bottom surface of said semiconductor substrate.

41. A power semiconductor device as claimed in claim 40, wherein said semiconductor substrate is a silicon substrate.

42. A power semiconductor device as claimed in claim 40, wherein said gate insulating layer is a gate oxide layer.

43. A power semiconductor device having a plurality of vertical double-diffused metal oxide semiconductor field effect transistors (MOSFETs) which are connected to each other in parallel, said power semiconductor device comprising:

a semiconductor substrate of a first conductivity type having a main surface and a bottom surface opposite to the main surface, said semiconductor substrate being doped with impurities of the first conductivity type that has substrate impurity concentration;

an epitaxial layer of the first conductivity type formed on the main surface of said semiconductor substrate, said epitaxial layer having a predetermined thickness and being doped with impurities of the first conductivity type that has epitaxial impurity concentration lower than the substrate impurity concentration of said semiconductor substrate;

a gate insulating layer formed on a surface of said epitaxial layer;

a gate electrode coating said gate insulating layer, said gate electrode having a plurality of square shaped opening windows each of which has a center positioned on each of lattice points of a two-dimensional square lattice comprising a plurality of unit cells, each of the unit cells being defined by two pairs of opposed sides, one pair of the opposed sides extending along a first direction and being apart from one another at a predetermined distance, another pair of the opposed sides extending along a second direction orthogonal to the first direction and being apart from one another at a predetermined distance, said gate electrode having a plurality of slit shaped opening windows each of which is laid on a straight line connecting two centers of two of said square shaped opening windows that are obliquely adjacent to one another;

a plurality of base leading electrodes of a second conductivity type which is opposite to the first conductivity type, said base leading electrodes being disposed in central portions of the respective square shaped opening windows;

a first insulating layer formed on an upper surface of said gate electrode;

a plurality of second insulating layers formed on side walls of said gate electrode and said base leading electrodes;

a plurality of base regions of the second conductivity type each of which has a predetermined base junction depth, said base regions being formed in the surface of said epitaxial layer, each of said base regions being self-aligned to at least three of the square shaped opening windows and at least two of the slit shaped opening windows, said base regions being directly connected to said base leading electrodes through respective direct contact holes;

a plurality of source regions of the first conductivity type each of which has a source junction depth shallower than the base junction depth, each of the said source regions having an outer edge self-aligned to the at least three of the square shaped opening windows and the at least two of the slit shaped opening windows and an inner edge spaced apart from edges of the at least three of the square shaped opening windows at a predetermined width;

a source electrode covering said first and said second insulating layers and said base leading electrodes, said source electrode being directly connected to said source regions with said source electrode short-circuited to said base regions through said base leading electrodes in the square shaped opening windows, said source electrode being directly connected to said source regions in the slit shaped opening windows; and a drain electrode formed on the bottom surface of said semiconductor substrate.

44. A power semiconductor device as claimed in claim 43, wherein said semiconductor substrate is a silicon substrate.

45. A power semiconductor device as claimed in claim 43, wherein said gate insulating layer is a gate oxide layer.

46. A power semiconductor device as claimed in claim 43, wherein each of said base leading electrodes consists of a polysilicon layer.

\* \* \* \* \*